United States Patent
Kato et al.

(10) Patent No.: US 10,324,127 B2
(45) Date of Patent: Jun. 18, 2019

(54) ELECTRONIC COMPONENT HANDLING APPARATUS, ELECTRONIC COMPONENT TESTING APPARATUS, AND ELECTRONIC COMPONENT TESTING METHOD

(71) Applicant: ADVANTEST CORPORATION, Tokyo (JP)

(72) Inventors: Yasuyuki Kato, Tokyo (JP); Masataka Onozawa, Tokyo (JP); Keisuke Nitta, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 84 days.

(21) Appl. No.: 15/617,266

(22) Filed: Jun. 8, 2017

(65) Prior Publication Data

US 2018/0356460 A1 Dec. 13, 2018

(51) Int. Cl.
*G01R 31/28* (2006.01)
*G01R 1/04* (2006.01)

(52) U.S. Cl.
CPC ....... *G01R 31/2891* (2013.01); *G01R 1/0433* (2013.01)

(58) Field of Classification Search
CPC .......................... G01R 31/2891; G01R 1/0433
See application file for complete search history.

(56) References Cited

U.S. PATENT DOCUMENTS

| | | | |
|---|---|---|---|
| 9,588,142 B2 * | 3/2017 | Kiyokawa | G01R 1/06794 |
| 2005/0151551 A1 | 7/2005 | Okuda et al. | |
| 2005/0168233 A1 | 8/2005 | Roberts et al. | |
| 2006/0061377 A1 | 3/2006 | Roberts et al. | |
| 2007/0063724 A1 | 3/2007 | Roberts et al. | |

(Continued)

FOREIGN PATENT DOCUMENTS

| | | |
|---|---|---|
| JP | 2005-169564 A | 6/2005 |
| JP | 2009-519435 A | 5/2009 |

(Continued)

*Primary Examiner* — Tung X Nguyen
*Assistant Examiner* — Dominic E Hawkins
(74) *Attorney, Agent, or Firm* — Greenblum & Bernstein, P.L.C.

(57) ABSTRACT

An electronic component handling apparatus (10) is provided which can improve the operation rate. The electronic component handling apparatus (10) includes: a contact arm (300) having a holding part (380) configured to hold a DUT (10A), the contact arm (300) being configured to press the DUT (10A) against a socket (410); an alignment device (200) including a camera (221) and a operation unit (230), the camera (221) being configured to image the DUT (10A) to acquire image information, the operation unit (230) being configured to adjust a position of the holding part (380) within a range of a maximum alignment amount ($AL_{max}$); and a control device (105) configured to control the contact arm (300) and the alignment device (200). When a predetermined condition is not satisfied, the control device (105) controls the contact arm (300) and the alignment device (200) so as to perform preliminary alignment work at least once. When the predetermined condition is satisfied, the control device (105) controls the contact arm (300) and the alignment device (200) so as to perform main alignment work.

6 Claims, 24 Drawing Sheets

(56) References Cited

U.S. PATENT DOCUMENTS

| | | | |
|---|---|---|---|
| 2007/0069752 A1* | 3/2007 | Ito | G01R 31/2887 |
| | | | 324/750.23 |
| 2009/0309620 A1* | 12/2009 | Roberts | G01R 31/2893 |
| | | | 324/757.01 |
| 2011/0254945 A1* | 10/2011 | Kikuchi | G01R 31/2893 |
| | | | 348/126 |
| 2011/0282593 A1* | 11/2011 | Nickel | G01R 31/04 |
| | | | 702/39 |
| 2013/0085604 A1 | 4/2013 | Irie et al. | |
| 2014/0111235 A1* | 4/2014 | Kikuchi | G01R 1/02 |
| | | | 324/750.23 |

FOREIGN PATENT DOCUMENTS

| | | |
|---|---|---|
| JP | 2013-078825 A | 5/2013 |
| JP | 2014-085230 A | 5/2014 |
| JP | 2016-134560 A | 7/2016 |
| WO | 2003/075023 A1 | 9/2003 |

\* cited by examiner

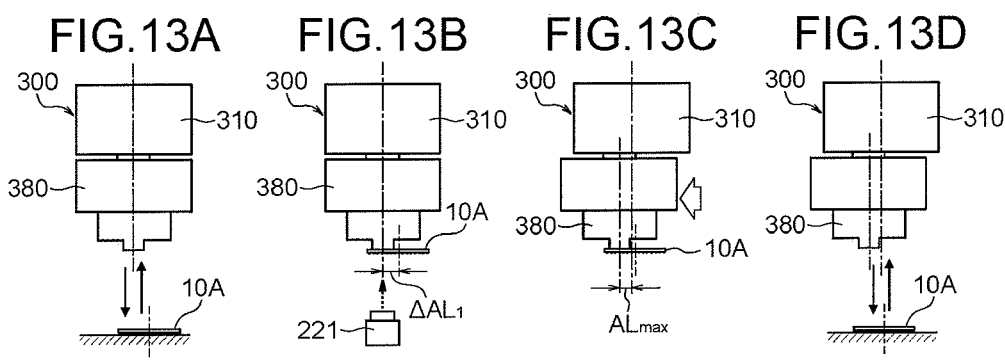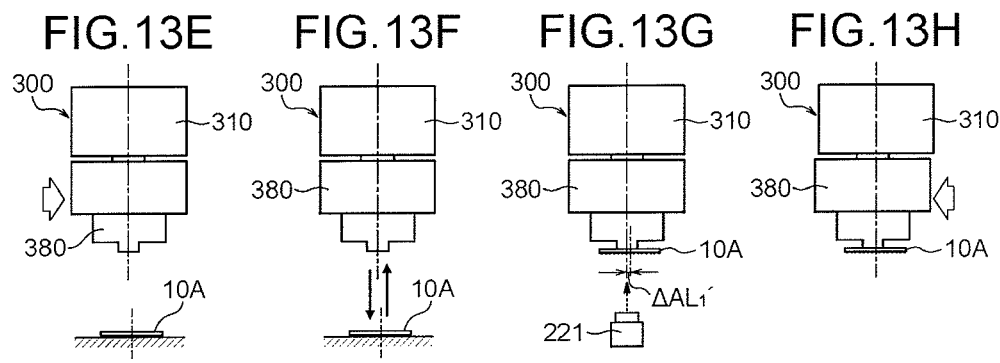

ELECTRONIC COMPONENT HANDLING APPARATUS, ELECTRONIC COMPONENT TESTING APPARATUS, AND ELECTRONIC COMPONENT TESTING METHOD

BACKGROUND OF THE INVENTION

1. Technical Field of the Invention

The present invention relates to an electronic component handling apparatus for positioning an electronic component under test (hereinafter, simply referred to as a "device under test (DUT)"), such as a semiconductor integrated circuit device, using an image processing technology, an electronic component testing apparatus including the electronic component handling apparatus, and an electronic component testing method using the electronic component handling apparatus.

2. Description of the Related Art

The contents described and/or illustrated in the documents relevant to the Japanese Patent Application No. 2012-234440 filed on Oct. 24, 2012 and the U.S. patent application Ser. No. 14/058,876 filed on Oct. 21, 2013 will be incorporated herein by reference as a part of the description and/or drawings of the present application.

An electronic component handling apparatus for positioning a DUT using an image processing technology is known which comprises a contact arm and an alignment device (for example, refer to Patent Document 1: WO2003/075023). The contact arm has a holding part that holds the DUT and a base part that is connected to the holding part via a lock and free mechanism. The alignment device has a camera that images the DUT held by the holding part and a driving part that relatively moves the holding part with respect to the base part. When the DUT is relatively positioned with respect to a socket, the camera images the DUT held by the holding part and thereafter, in a state in which the lock and free mechanism is released, the holding part is relatively moved with respect to the base part on the basis of the image information.

Patent Document 1: WO2003/075023

SUMMARY OF THE INVENTION

When a correction amount for the position of the DUT exceeds a maximum alignment amount of the alignment device, an alarm may be generated to shut down the electronic component handling apparatus and, unfortunately, the operation rate of the electronic component handling apparatus will deteriorate.

An object of the present invention is therefore to provide an electronic component handling apparatus, an electronic component testing apparatus, and an electronic component testing method that are able to improve the operation rate.

<1> The electronic component handling apparatus according to the invention is an electronic component handling apparatus configured to handle a DUT, comprising: a contact arm having a holding part configured to hold the DUT, the contact arm being configured to press the DUT against a socket; an alignment device including an imaging part and a driving part, the imaging part being configured to image the DUT to acquire image information, the driving part being configured to adjust a position of the holding part within a range of a maximum alignment amount; and a control device configured to control the contact arm and the alignment device, wherein, when a predetermined condition is not satisfied, the control device controls the contact arm and the alignment device so as to perform preliminary alignment work at least once for satisfying the predetermined condition, and when the predetermined condition is satisfied, the control device controls the contact arm and the alignment device so as to perform main alignment work for relatively positioning the DUT with respect to the socket.

<2> In the above invention, the control device may determine whether the predetermined condition is satisfied or not on the basis of the image information.

<3> In the above invention, the preliminary alignment work may include a first operation in which the holding part holds the DUT, a second operation in which the driving part adjusts the position of the holding part, and a third operation in which the holding part places the DUT, and the main alignment work may include at least a fourth operation in which the holding part holds the DUT again.

<4> In the above invention, the control device may calculate a correction amount for the position of the holding part on the basis of the image infoiniation, and the predetermined condition may include a condition that the correction amount is the maximum alignment amount or less, wherein, when the correction amount is larger than the maximum alignment amount, the control device may control the driving part to adjust the position of the holding part by the maximum alignment amount, and when the correction amount is the maximum alignment amount or less, the control device may control the driving part to adjust the position of the holding part by the correction amount.

<5> In the above invention, the socket may be provided at a test head or at a tip of the holding part, at least the preliminary alignment work of the preliminary aligmnent work and main alignment work may include an operation in which the imaging part images the DUT, the DUT imaged by the imaging part may be in a state of being held by the holding part or in a state before being held by the holding part, the second operation may include an operation in which the driving part adjusts the position of the holding part by the maximum alignment amount, and the main alignment work may include a fifth operation in which the driving part adjusts the position of the holding part by the correction amount.

<6> In the above invention, the predetermined condition may include a condition that the tip of the holding part does not protrude from the DUT.

<7> In the above invention, the control device may calculate a center-to-center distance and a correction amount for the position of the holding part on the basis of the image information, the center-to-center distance is a distance between the center of the holding part and the center of the DUT, the predetermined condition may include a condition that the center-to-center distance is a predetermined value or less, wherein, when the center-to-center distance is larger than the predetermined value, the control device may control the driving part so that the center-to-center distance becomes the predetermined value or less, and when the center-to-center distance is the predetermined value or less, the control device may control the driving part to adjust the position of the holding part by the correction amount.

<8> In the above invention, the socket may be provided at a test head, at least the preliminary alignment work of the preliminary alignment work and main alignment work may include an operation in which the imaging part images the DUT, the DUT imaged by the imaging part may be in a state of being held by the holding part, the second operation may include an operation in which the driving part adjusts the position of the holding part so that the center-to-center distance becomes the predetermined value or less, and the main alignment work may include a fifth operation in which the driving part adjusts the position of the holding part by the correction amount.

<9> In the above invention, when the preliminary alignment work is performed, the control device may calculate a correction amount after the preliminary alignment work.

<10> In the above invention, the control device may limit the maximum number of executions of the preliminary alignment work.

<11> In the above invention, the contact arm may have a base part, an adjustment unit configured to relatively move and/or rotate the holding part with respect to the base part, and a lock and free unit configured to restrain relative movement and/or rotation of the holding part with respect to the base part, and the driving part may include an operation unit configured to operate the adjustment unit.

<12> The electronic component testing apparatus according to the invention is an electronic component testing apparatus configured to test a DUT, comprising: the above electronic component handling apparatus; a test head to which the socket is attached; and a tester to which the test head is electrically connected.

<13> The electronic component testing method according to the invention is an electronic component testing method for relatively positioning a DUT with respect to a socket using image information of the DUT and testing the DUT. The electronic component testing method comprises: performing preliminary alignment work at least once for satisfying a predetermined condition when the predetermined condition is not satisfied; and performing main alignment work for relatively positioning the DUT with respect to the socket when the predetermined condition is satisfied.

<14> In the above invention, the electronic component testing method may comprise a determining step of determining whether the predetermined condition is satisfied or not on the basis of the image information.

<15> In the above invention, the electronic component testing method may be performed using an electronic component handling apparatus, the electronic component handling apparatus may comprise: a contact arm having a holding part configured to hold the DUT, the contact arm being configured to press the DUT against a socket; and an alignment device including an imaging part and a driving part, the imaging part being configured to image the DUT to acquire image information, the driving part being configured to adjust a position of the holding part within a range of a maximum alignment amount, the preliminary alignment work may include a first operation in which the holding part holds the DUT, a second operation in which the driving part adjusts the position of the holding part, and a third operation in which the holding part places the DUT, the main alignment work may include at least a fourth operation in which the holding part holds the DUT again, and the electronic component testing method may comprise a pressing step of pressing the DUT against the socket.

<16> In the above invention, the electronic component testing method may comprise a calculation step of calculating a correction amount for the position of the holding part on the basis of the image information, the predetermined condition may include a condition that the correction amount is the maximum alignment amount or less, the preliminary alignment work may include work in which the driving part adjusts the position of the holding part by the maximum alignment amount, and the main alignment work may include work in which the driving part adjusts the position of the holding part by the correction amount.

<17> In the above invention, the socket may be provided at a test head or at a tip of the holding part, at least the preliminary alignment work of the preliminary alignment work and main alignment work may include an operation in which the imaging part images the DUT, the DUT imaged by the imaging part may be in a state of being held by the holding part or in a state before being held by the holding part, the second operation may include an operation in which the driving part adjusts the position of the holding part by the maximum alignment amount, and the main alignment work may include a fifth operation in which the driving part adjusts the position of the holding part by the correction amount.

<18> In the above invention, the predetermined condition may include a condition that the tip of the holding part does not protrude from the DUT.

<19> In the above invention, the electronic component testing method may comprise a calculation step of calculating a center-to-center distance and a correction amount for the position of the holding part on the basis of the image information, the center-to-center distance is a distance between the center of the holding part and the center of the DUT, the predetermined condition may include a condition that the center-to-center distance is a predetermined value or less, the preliminary alignment work may include work in which the driving part adjusts the position of the holding part so that the center-to-center distance becomes the predetermined value or less, and the main alignment work may include work in which the driving part adjusts the position of the holding part by the correction amount.

<20> In the above invention, the socket may be provided at a test head, at least the preliminary alignment work of the preliminary alignment work and main alignment work may include an operation in which the imaging part images the DUT, the DUT imaged by the imaging part may be in a state of being held by the holding part, the second operation may include an operation in which the driving part adjusts the position of the holding part so that the center-to-center distance becomes the predetermined value or less, and the main alignment work may include a fifth operation in which the driving part adjusts the position of the holding part by the correction amount.

<21> In the above invention, the electronic component testing method may comprise a recalculation step of calculating a correction amount after the preliminary alignment work when the preliminary alignment work is performed.

<22> In the above invention, the electronic component testing method may comprise a limiting step of limiting the maximum number of executions of the preliminary alignment work.

<23> In the above invention, the contact arm may have a base part, an adjustment unit configured to relatively move and/or rotate the holding part with respect to the base part, and a lock and free unit configured to restrain relative movement and/or rotation of the holding part with respect to the base part, and the driving part may include an operation unit configured to operate the adjustment unit.

In the present invention, when the predetermined condition is not satisfied, the preliminary alignment work for satisfying the predetermined condition is performed at least once, and when the predetermined condition is satisfied, the main alignment work is performed for relatively positioning the DUT with respect to the socket. Thus, even when the correction amount for the DUT exceeds the maximum alignment amount of the alignment device, the main alignment work can be performed and it is therefore possible to improve the operation rate of the electronic component handling apparatus.

BRIEF DESCRIPTION OF DRAWINGS

FIGS. 13A to 13H are views illustrating an alignment operation in each step of FIG. 12;

DESCRIPTION OF THE PREFERRED EMBODIMENT

«First Embodiment»

Hereinafter, a first embodiment of the present invention will be described with reference to the accompanying drawings.

Figure 1:
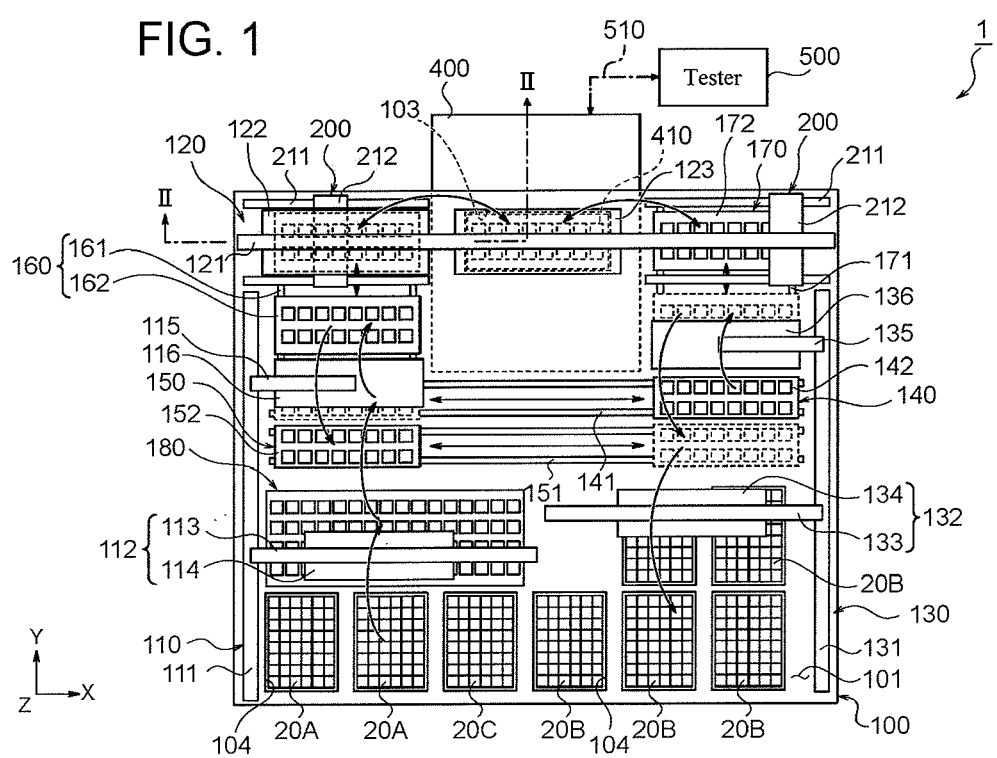
FIG. 1 is a plan view illustrating an electronic component testing apparatus in a first embodiment of the present invention.

First, an overview of the entire configuration of an electronic component testing apparatus 1 in the present embodiment will be described with reference to FIG. 1. FIG. 1 is a plan view illustrating the electronic component testing apparatus 1 in the present embodiment.

As illustrated in FIG. 1, the electronic component testing apparatus 1 in the present embodiment includes a handler 100, a test head 400, and a tester 500, and is an apparatus that performs positioning of DUTs 10A (refer to FIG. 8, etc.) and the like using an image processing technology and then tests the DUTs 10A.

The test head 400 is inserted into a space 102 (refer to FIG. 2) formed below a base plate 101 of the handler 100, and sockets 410 of the test head 400 face the inside of the handler 100 through an opening 103 (refer to FIG. 2) formed in the base plate 101. The test head 400 is electrically connected to the tester 500 through a cable 510. A set of 16 sockets (2 rows by 8 columns) 410 is provided on the test head 400 so that 16 DUTs 10A can be simultaneously tested.

Note that the number of sockets 410 on the test head 400 is not particularly limited. For example, 4, 8, 32, or 64 sockets may be provided on the test head. The handler 100 in the present embodiment is equivalent to an example of the electronic component handling apparatus in the present invention.

In the electronic component testing apparatus 1, the handler 100 transports the DUTs 10A before the test from a customer tray 20A to the test head 400 and presses the DUTs 10A against the sockets 410 of the test head 400 using contact arms 300. Then, after the test head 400 and the tester 500 test the DUTs 10A, the handler 100 places the tested DUTs 10A on a customer tray 20B while sorting the tested DUTs 10A according to the test results.

Figure 8:
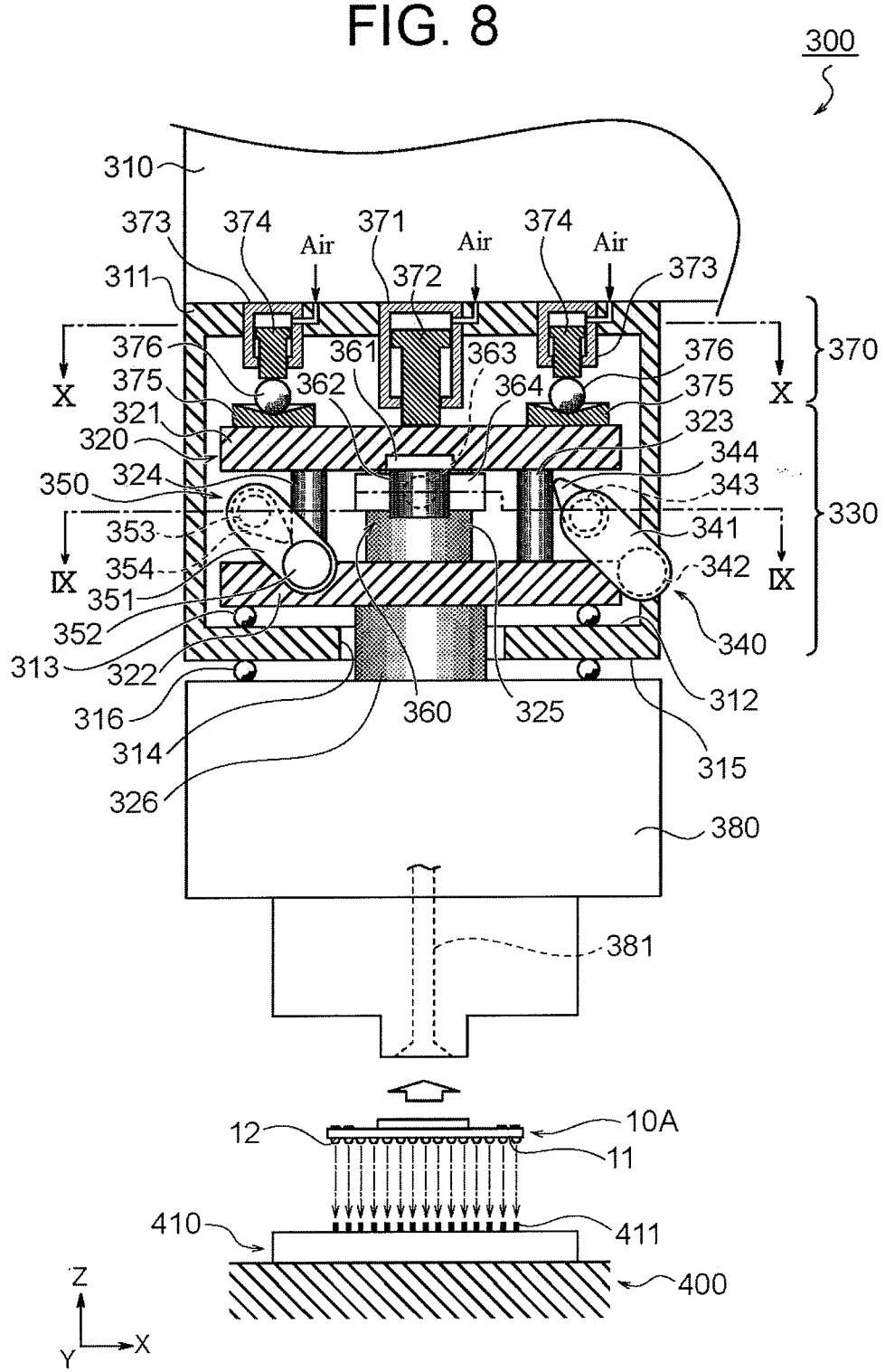
FIG. 8 is a partial cross-sectional view illustrating the internal structure of a contact arm in the first embodiment of the present invention.

Each DUT 10A in the present embodiment has first terminals 12 provided on its bottom surface 11 (refer to FIG. 8). As will be described later, the DUT 10A held by a holding part 380 of the contact arm 300 is positioned relative to the socket 410 of the test head 400 using the image processing technology.

Hereinafter, the configuration of the handler 100 in the present embodiment will be described in detail with reference to FIG. 1.

As illustrated in FIG. 1, the handler 100 in the present embodiment includes three transport devices 110 to 130, two X-direction buffers 140 and 150, two Y-direction buffers 160 and 170, a heat plate 180, and two alignment devices 200.

The first transport device 110 includes a Y-direction rail 111, a feed arm 112, and a first transfer arm 115. The Y-direction rail 111 is constructed above the base plate 101 of the handler 100 and extends along the Y direction.

The feed arm 112 includes an X-direction rail 113 and a movable head 114. The X-direction rail 113 can move on the Y-direction rail 111 along the Y direction. The movable head 114 can move on the X-direction rail 113 along the X direction. Although not illustrated in particular, the movable head 114 includes 16 suction heads that can each adsorb and hold the DUT 10A, and these suction heads can move up and down independently of each other.

The customer trays 20A and 20B are disposed in window portions 104 of the base plate 101, and the feed arm 112 takes up the DUTs 10A before the test from the customer tray 20A and moves them to the heat plate 180. Note that, in FIG. 1, the DUTs 10A before the test are placed on the two customer trays 20A on the left side. On the other hand, the tested DUTs 10A are placed on the five customer trays 20B on the right side in FIG. 1, and each customer tray 20B is matched with the test result of the DUTs 10A. Incidentally, a customer tray 20C located next to the right side in FIG. 1 of the two customer trays 20A is an empty customer tray on which no DUTs 10A are placed.

A number of suction parts are opened on the surface of the heat plate 180. When the DUTs 10A are placed on the heat plate 180 by the feed arm 112, the DUTs 10A are held by the suction parts and heated by a heater (not illustrated) embedded in the heat plate 180. After the DUTs 10A are sufficiently heated, the feed arm 112 moves the DUTs 10A from the heat plate 180 to the first X-direction buffer 140.

The first X-direction buffer 140 includes an X-direction rail 141 and a moving plate 142. The X-direction rail 141 is provided on the base plate 101 and extends between the operating range of the first transfer arm 115 and the operating range of a second transfer arm 135, which will be described later, along the X direction. The moving plate 142 can move on the X-direction rail 141 along the X direction. A set of 16 suction parts is opened on the surface of the moving plate 142 and when the feed arm 112 places the DUTs 10A on the moving plate 142, the DUTs 10A are held by the suction parts.

Here, as will be described later, the second transport device 120 includes two movable heads 122 and 123. Accordingly, while one movable head 122 (or 123) is doing alignment work, the other movable head 123 (or 122) can press the DUTs 10A against the sockets 410. Thus, the time required for alignment work is absorbed by each other and it is thereby possible to improve the throughput.

For this reason, in the present embodiment, when feeding the DUTs 10A to the first movable head 122 on the left side in FIG. 1, the first X-direction buffer 140 remains positioned within the operating range of the first transfer arm 115 even after the placement of the DUTs 10A by the first feed arm 112. In contrast, when feeding the DUTs 10A to the second movable head 123 on the right side in FIG. 1, the first X-direction buffer 140 moves into the operating range of the second transfer arm 135 after the placement of the DUTs 10A by the first feed arm 112.

When feeding the DUTs 10A to the first movable head 122, the first transfer arm 115 moves the DUTs 10A from the first X-direction buffer 140 to the first Y-direction buffer 160.

The first transfer arm 115 includes a movable head 116 that can move on the Y-direction rail 111 along the Y direction. Although not illustrated in particular, the movable head 116 includes 16 suction heads that can adsorb and hold the DUTs 10A, and these suction heads can move up and down independently of each other.

On the other hand, the first Y-direction buffer 160 includes a Y-direction rail 161 and a moving plate 162. The Y-direction rail 161 is provided on the base plate 101 and extends between the operating range of the first transfer arm 115 and the operating range of the first movable head 122 along the Y direction. The moving plate 162 can move on the Y-direction rail 161 along the Y direction. A set of 16 suction parts 163 (refer to FIG. 2) is formed on the surface of the moving plate 162. When the first transfer arm 115 places the DUTs 10A on the moving plate 162, the DUTs 10A are held by the suction parts 163.

When the DUTs 10A are placed by the first transfer arm 115, the first Y-direction buffer 160 moves the moving plate 162 into the operating range of the first movable head 122 of the second transport device 120.

In the present embodiment, the alignment device 200 is provided in an overlapping portion between the operating range of the first Y-direction buffer 160 and the operating range of the first movable head 122. The first movable head 122 takes up the DUTs 10A from the first Y-direction buffer 160 while positioning the DUTs 10A using the alignment device 200. Note that the structure of the alignment device 200 will be described in detail later.

The second transport device 120 includes an X-direction rail 121 and the first and second movable heads 122 and 123. The X-direction rail 121 is constructed above the base plate 101 of the handler 100 and extends along the X direction. The first and second movable heads 122 and 123 can move on the X-direction rail 121 along the X direction independently of each other.

Each of the first and second movable heads 122 and 123 includes 16 contact arms 300 arrayed in 2 rows by 8 columns. Accordingly, each of the first and second movable heads 122 and 123 can hold 16 DUTs 10A simultaneously (refer to FIG. 2). In addition, a first camera 125 for imaging the sockets 410 of the test head 400 is provided in each of the first and second movable heads 122 and 123 (refer to FIG. 2). Note that the configuration of the contact arm 300 will be described later.

Note that the number of contact arms 300 provided in each of the first and second movable heads 122 and 123 is not particularly limited to the number described above, but is set according to the number of sockets 410 on the test head 400.

The first movable head 122 moves the DUTs 10A above the sockets 410 of the test head 400 and then lowers the contact arms 300 to make the DUTs 10A electrically connected to the sockets 410. In this state, the test head 400 and the tester 500 test the DUTs 10A by inputting and outputting test signals with respect to the DUTs 10A.

After the test of the DUTs 10A is completed, the first movable head 122 returns the DUTs 10A to the first Y-direction buffer 160. Then, the tested DUTs 10A are moved into the operating range of the first transfer arm 115 by the first Y-direction buffer 160 and transshipped from the first Y-direction buffer 160 to the second X-direction buffer 150 by the first transfer arm 115. Then, the tested DUTs 10A are transported into the operating range of a sorting arm 132 of the third transport device 130 by the second X-direction buffer 150.

Note that, similarly to the first X-direction buffer 140 described above, the second X-direction buffer 150 includes an X-direction rail 151 and a moving plate 152 so that it is possible to move the DUTs 10A between the operating range of the first transfer arm 115 and the operating range of the sorting arm 132.

On the other hand, when feeding the DUTs 10A to the second movable head 123 on the right side in FIG. 1, the first X-direction buffer 140 moves into the operating range of the second transfer arm 135 of the third transport device 130, and the second transfer arm 135 transships the DUTs 10A from the first X-direction buffer 140 to the second Y-direction buffer 170.

The third transport device 130 includes a Y-direction rail 131, the sorting arm 132, and the second transfer arm 135. The Y-direction rail 131 is constructed above the base plate 101 of the handler 100 and extends along the Y direction.

The second transfer arm 135 includes a movable head 136 that can move on the Y-direction rail 131 along the Y direction. Although not illustrated in particular, the movable head 136 includes 16 suction heads that can adsorb and hold the DUTs 10A, and these suction heads can move up and down independently of each other.

When the DUTs 10A are placed in the second Y-direction buffer 170 by the second transfer arm 135, the second Y-direction buffer 170 moves into the operating range of the second movable head 123 of the second transport device 120.

Similarly to the first Y-direction buffer 160 described above, the second Y-direction buffer 170 includes a Y-direction rail 171 and a moving plate 172 so that it is possible to move the DUTs 10A between the operating range of the second transfer arm 135 and the operating range of the second movable head 123.

The alignment device 200 is also provided in an overlapping portion between the operating range of the second Y-direction buffer 170 and the operating range of the second movable head 123. The second movable head 123 takes up the DUTs 10A from the second Y-direction buffer 170 while positioning the DUTs 10A using the alignment device 200.

Then, the second movable head 123 moves the DUTs 10A above the sockets 410 and then lowers the contact arms 300 to make the DUTs 10A electrically connected to the sockets 410. In this state, the test head 400 and the tester 500 test the DUTs 10A by inputting and outputting test signals with respect to the DUTs 10A.

After the test of the DUTs 10A is completed, the second movable head 123 returns the DUTs 10A to the second Y-direction buffer 170. Then, the tested DUTs 10A are moved into the operating range of the second transfer arm 135 by the second Y-direction buffer 170 and transshipped from the second Y-direction buffer 170 to the second X-direction buffer 150 by the second transfer arm 135.

The sorting arm 132 of the third transport device 130 includes an X-direction rail 133 and a movable head 134. The X-direction rail 133 can move on the Y-direction rail 131 along the Y direction. In addition, the movable head 134 can move on the X-direction rail 133 along the X direction. Although not illustrated in particular, the movable head 134 includes 16 suction heads that can adsorb and hold the DUTs 10A, and these suction heads can move up and down independently of each other.

The sorting arm 132 transships the tested DUTs 10A from the second X-direction buffer 150 to the customer tray 20B. At this time, the sorting arm 132 sorts the DUTs 10A according to the test results by moving the DUTs 10A to the customer tray 20B corresponding to the test results.

Next, the configuration of the alignment device 200 in the present embodiment will be described with reference to FIGS. 2 to 6.

Note that, although the configuration of the alignment device 200 provided within the operating range of the first movable head 122 will be described below, the alignment device 200 provided within the operating range of the second movable head 123 also has the same configuration.

Figure 2:
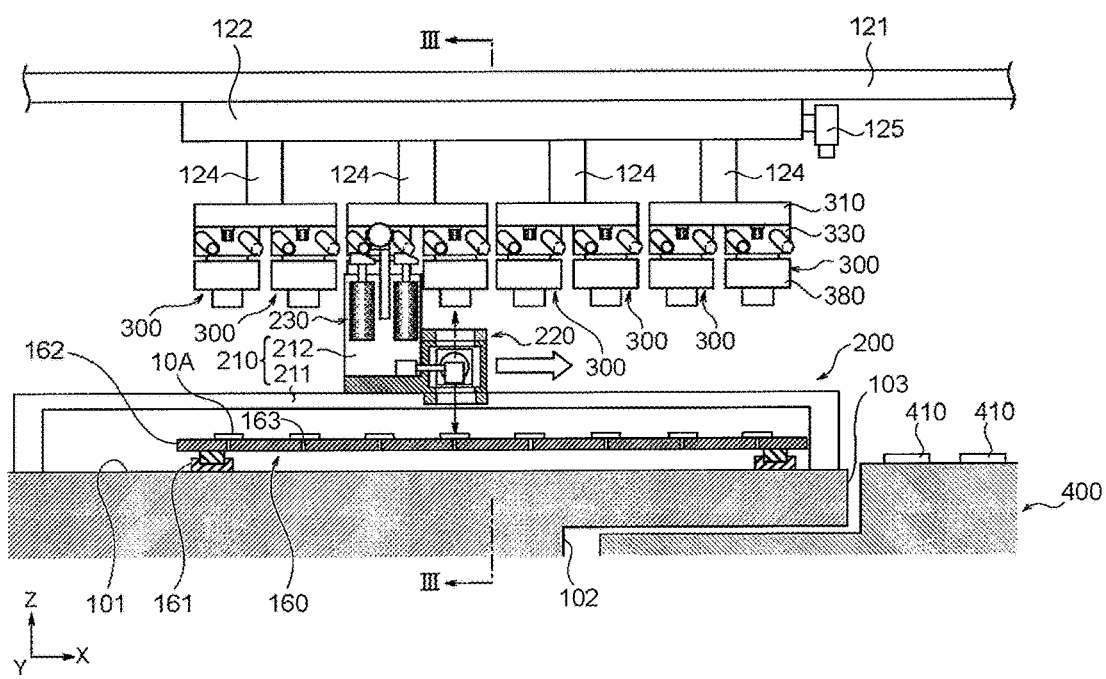
FIG. 2 is a cross-sectional view taken along the line II-II of FIG. 1.
Figure 3:
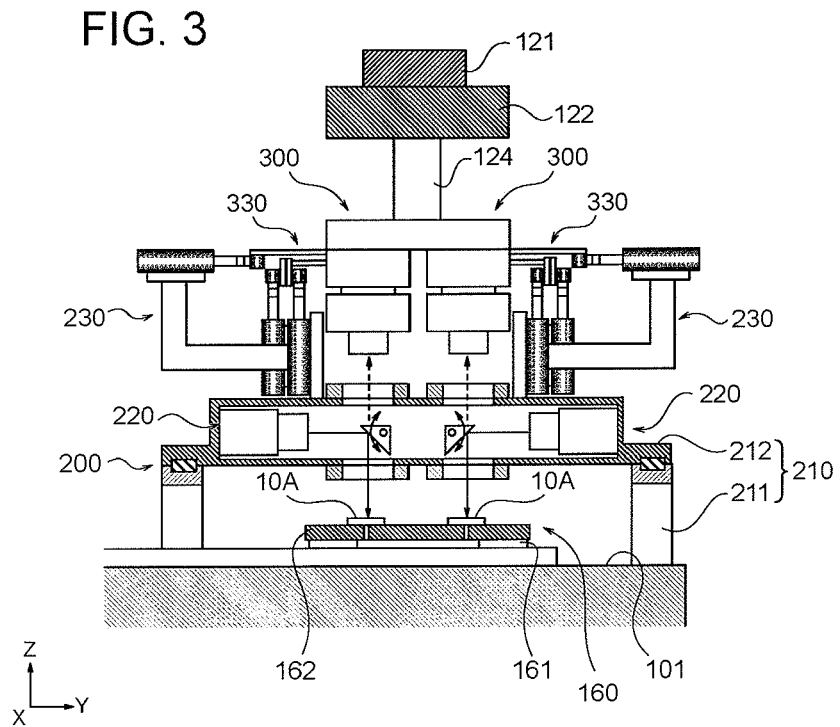
FIG. 3 is a cross-sectional view taken along the line of FIG. 2.
Figure 4:
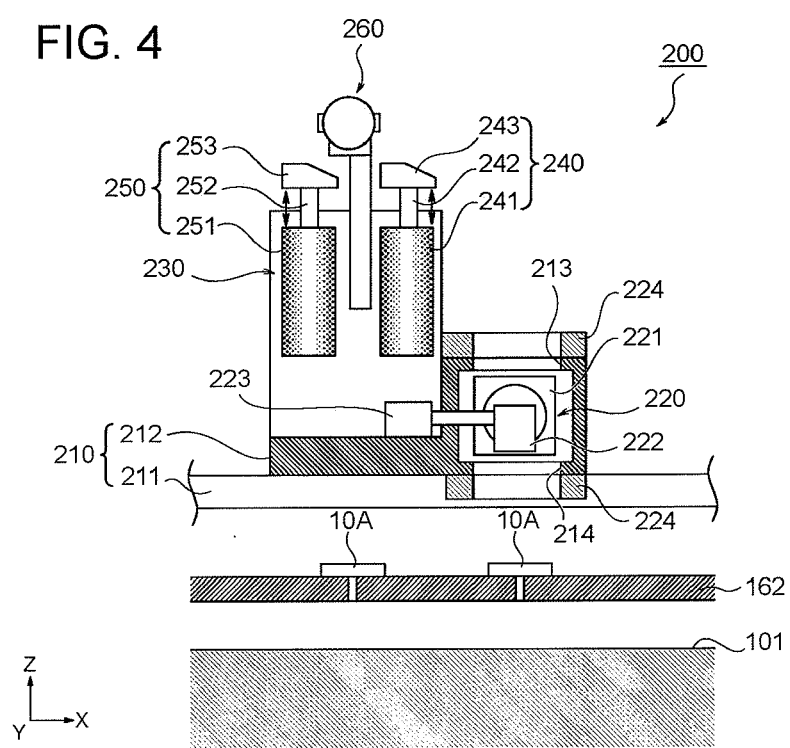
FIG. 4 is an enlarged view of an alignment device illustrated in FIG. 2.
Figure 5:
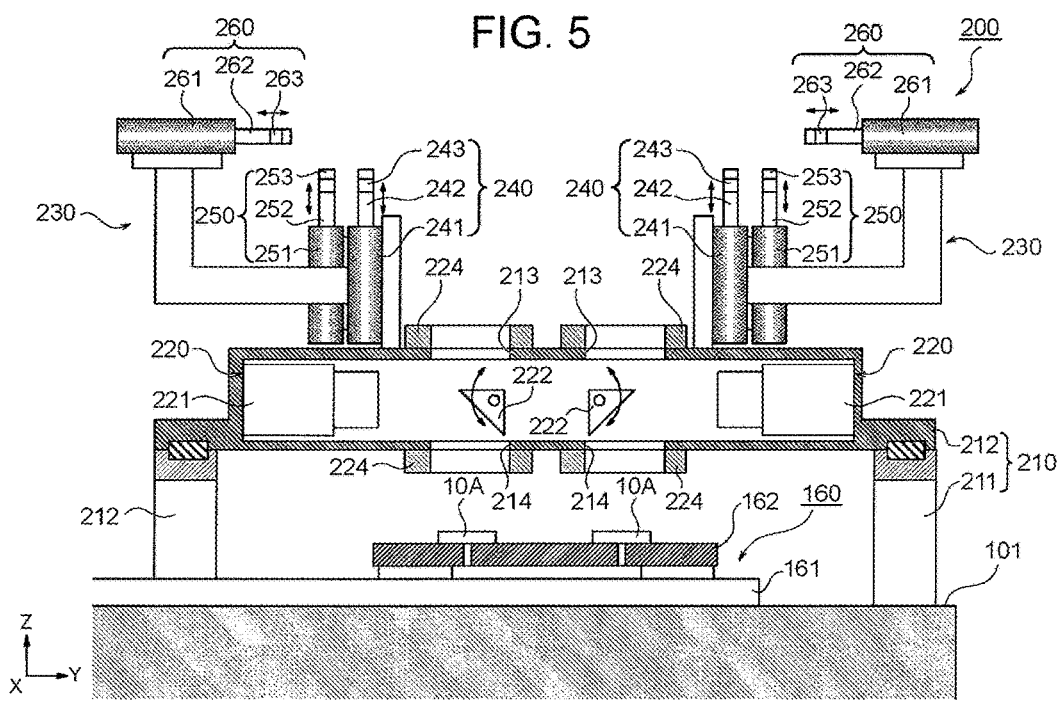
FIG. 5 is an enlarged view of an alignment device illustrated in FIG. 3.
Figure 6:
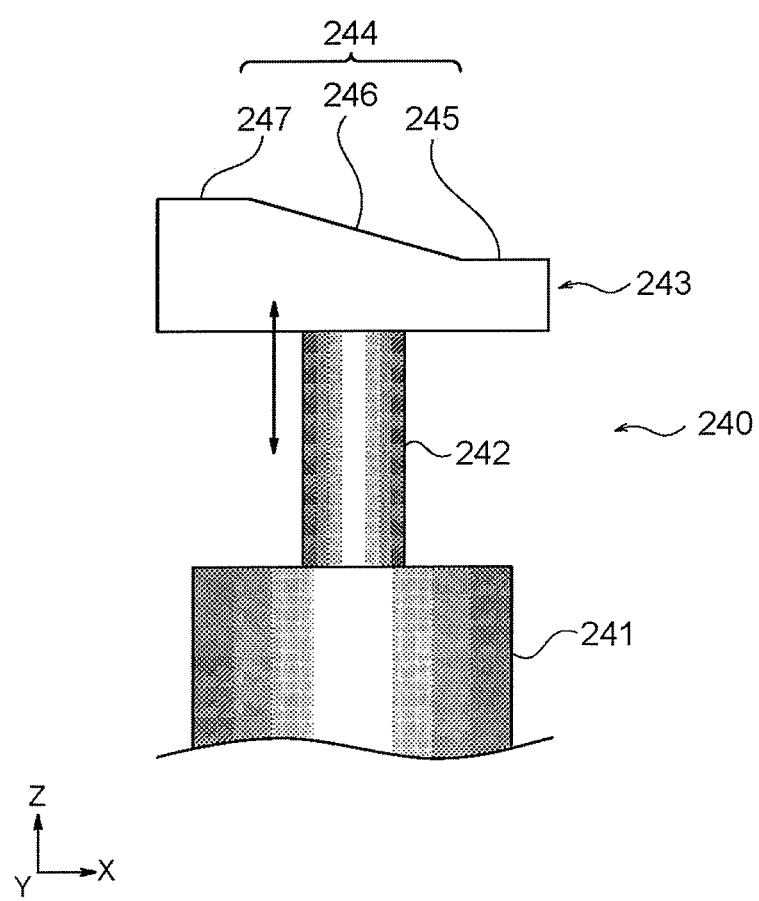
FIG. 6 is an enlarged view of an operation unit in the first embodiment of the present invention.

FIG. 2 is a cross-sectional view taken along the line II-II of FIG. 1. FIG. 3 is a cross-sectional view taken along the line of FIG. 2. FIGS. 4 and 5 are enlarged views of alignment devices illustrated in FIGS. 2 and 3. FIG. 6 is an enlarged view of an operation unit in the embodiment of the invention.

The alignment device 200 in the present embodiment is a device used for the positioning of the DUTs 10A. As illustrated in FIGS. 2 to 5, the alignment device 200 includes a moving unit 210, imaging units 220, and operation units 230.

The moving unit 210 includes X-direction rails 211 and a slide portion 212. A pair of X-direction rails 211 extends along the X direction so as to be positioned on the left and right sides of the moving plate 162 of the first Y-direction buffer 160 located within the operating range of the first movable head 122.

The slide portion 212 is configured to be able to slide on the X-direction rails 211 along the X direction by a motor and a belt mechanism (not illustrated in particular). The imaging units 220 and the operation units 230 are provided in the slide portion 212 so that the imaging units 220 and the operation units 230 can also move in the X direction together with the slide portion 212.

In the present embodiment, the imaging units 220 and the operation units 230 are provided in the slide portion 212 so as to be spaced apart from each other by substantially the same pitch as the pitch between the contact arms 300 in the X direction. For this reason, imaging of the DUTs 10A by the imaging units 220 and the operation of adjustment units 330 by the operation units 230 can be simultaneously performed.

Note that the pitch between the imaging units 220 and the operation units 230 is not particularly limited to the above-described pitch. In an alternative embodiment, the imaging units 220 and the operation units 230 may be provided in separate moving units so that the imaging units 220 and the operation units 230 can move independently of each other.

Each imaging unit 220 includes a second camera 221, a mirror 222, an air cylinder 223, and a light 224. The second camera 221 is, for example, an imaging means having a CCD device, a lens, and the like, and is laterally placed in the slide portion 212. The mirror 222 is disposed on the optical axis of the second camera 221.

The mirror 222 is fixed to the driving shaft of the air cylinder 223. By driving of the air cylinder 223, it is possible to rotate the mirror 222 by 90° through the driving shaft. Accordingly, it is possible to switch the optical axis of the second camera 221 upward or downward.

In addition, openings 213 and 214 through which the optical axis of the second camera 221 reflected by the mirror 222 passes are formed in the slide portion 212. Therefore, according to the switching of the direction of the optical axis by the mirror 222, the second camera 221 can image the DUT 10A placed on the moving plate 162 of the first Y-direction buffer 160, image the holding part 380 itself of the contact arm 300, or image the DUT 10A held by the holding part 380 of the contact arm 300.

Further, the light 224 in which LEDs are annularly arrayed is provided in each of the openings 213 and 214 of the slide portion 212. Accordingly, it is possible to illuminate the DUT 10A or the holding part 380 at the time of imaging by the second camera 221.

Each operation unit 230 is a unit that operates the adjustment unit 330 of the contact arm 300 to be described later and includes three operation portions 240 to 260. The operation unit 230 can perform relative movement and/or rotation of the holding part 380 of the contact arm 300 with respect to a base part 310 via the adjustment unit 330 (which will be described later) of the contact arm 300. In the present embodiment, the operation unit 230 can adjust the position of the holding part 380 of the contact arm 300 within a range of a maximum alignment amount $AL_{max}$ ($AL_{max}=(X_{ALmax}, Y_{ALmax}, \theta_{ALmax})$). The above $\theta_{ALmax}$ represents the rotation around the Z direction. In the present embodiment, "adjusting a position" includes only performing "relative movement," only performing "relative rotation," and performing "relative movement and rotation."

The first operation portion 240 is a mechanism for operating a first adjustment portion 340 (which will be described later) of the adjustment unit 330 and includes a first motor 241, a first shaft 242, and a first translating (linear advancement) cam 243.

The first motor 241 is fixed to the slide portion 212 of the moving unit 210, so that it is possible to expand and contract the first shaft 242 along the Z-axis direction. The first translating cam 243 is attached to the distal end of the first shaft 242.

As illustrated in FIG. 6, the first translating cam 243 has a cam surface 244 on which a first cam follower 342 (which will be described later) of the first adjustment portion 340 rolls, and the cam surface 244 includes a first flat surface 245, an inclined surface 246, and a second flat surface 247.

The first and second flat surfaces 245 and 247 extend substantially in parallel to the movement direction (X direction) of the slide portion 212. On the other hand, the inclined surface 246 is provided between the two flat surfaces 245 and 247 and inclined with respect to the movement direction (X direction) of the slide portion 212.

The second operation portion 250 is a mechanism for operating a second adjustment portion 350 (which will be described later) of the adjustment unit 330. Similarly to the first operation portion 240, the second operation portion 250 also includes a second motor 251, a second shaft 252, and a second translating cam 253.

The second motor 251 is fixed to the slide portion 212 of the moving unit 210, so that it is possible to expand and contract the second shaft 252 along the Z-axis direction. The second translating cam 253 having the same shape as the first translating cam 243 is attached to the distal end of the second shaft 252. A second cam follower 352 (which will be described later) of the second adjustment portion 350 rolls on the cam surface of the second translating cam 253.

The third operation portion 260 is a mechanism for operating a third adjustment portion 360 (which will be described later) of the adjustment unit 330. Similarly to the first and second operation portions 240 and 250, the third operation portion 260 also includes a third motor 261, a third shaft 262, and a third translating cam 263. However, the third operation portion 260 is different from the first and second operation portions 240 and 250 in that the third motor 261 is fixed to the slide portion 212 of the moving unit 210 so as to expand and contract the third shaft 262 along the Y direction.

The third translating cam 263 having the same shape as the first and second translating cams 243 and 253 is attached to the distal end of the third shaft 262. A third cam follower 362 (which will be described later) of the third adjustment portion 360 rolls on the cam surface of the third translating cam 263.

In the present embodiment, since 16 contact arms 300 are arrayed in 2 rows by 8 columns in the first movable head 122 of the second transport device 120, two sets of imaging units 220 are provided in the slide portion 212 and two sets of operation units 230 are provided in the slide portion 212.

Next, the configuration of the contact arm 300 in the present embodiment will be described with reference to FIGS. 7 to 10.

Note that, although the configuration of the contact arm 300 of the first movable head 122 will be described below, the contact arm 300 of the second movable head 123 also has the same configuration.

Figure 7:
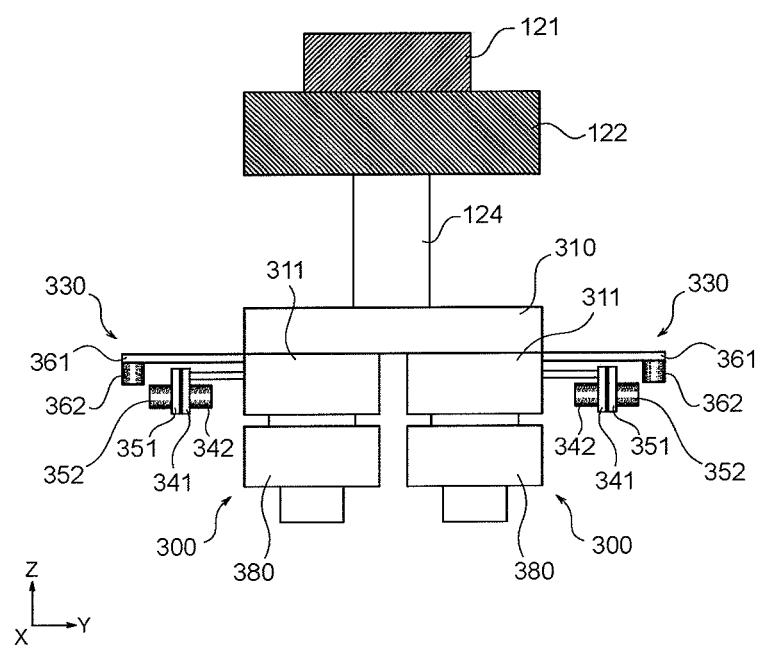
FIG. 7 is an enlarged view of contact arms illustrated in FIG. 3.
Figure 9:
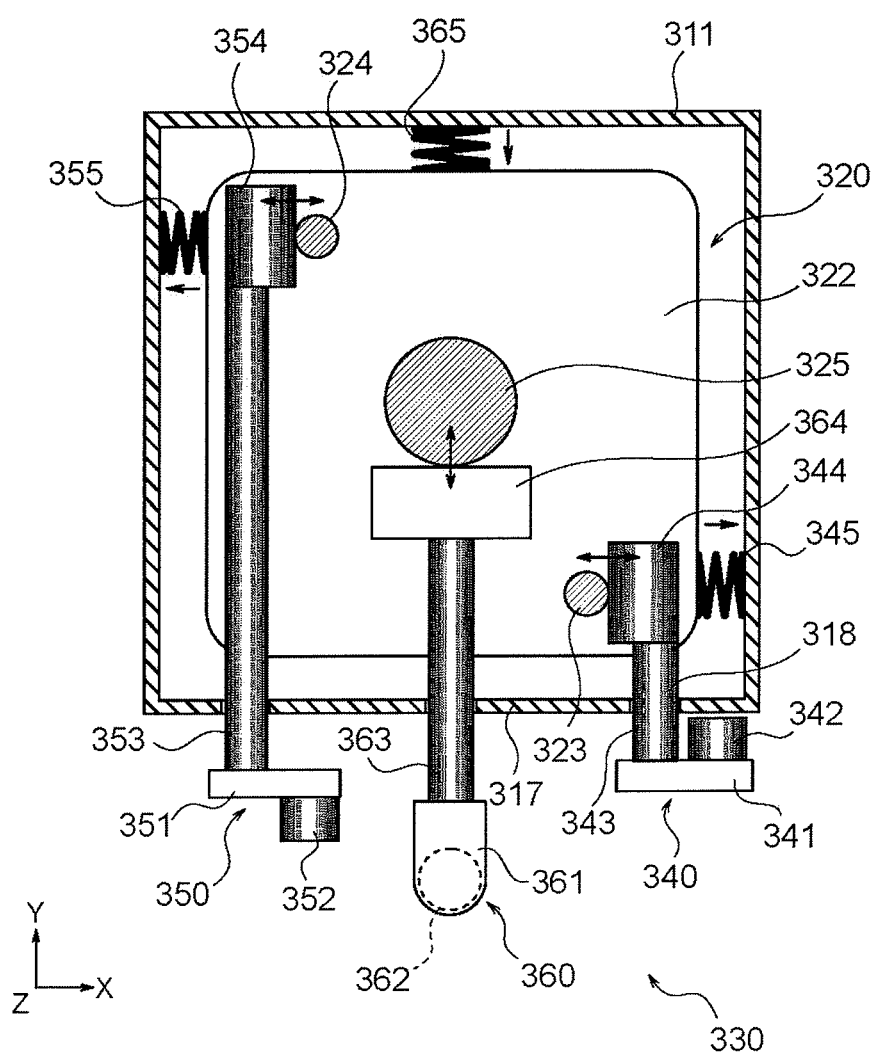
FIG. 9 is a cross-sectional view taken along the line IX-IX of FIG. 8.
Figure 10:
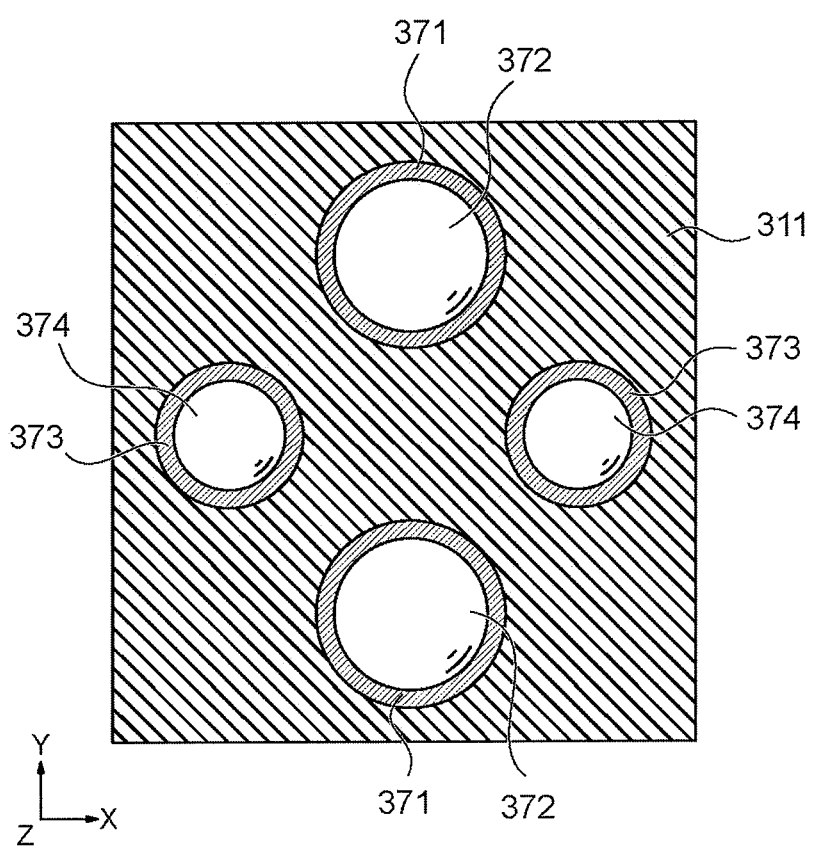
FIG. 10 is a cross-sectional view taken along the line X-X of FIG. 8.

FIG. 7 is an enlarged view of the contact arms illustrated in FIG. 3. FIG. 8 is a partial cross-sectional view illustrating the internal structure of a contact arm. FIG. 9 is a cross-sectional view taken along the line IX-IX of FIG. 8. FIG. 10 is a cross-sectional view taken along the line X-X of FIG. 8.

As illustrated in FIGS. 7 and 8, the contact arm 300 in the present embodiment includes the base part 310, a floating unit 320, the adjustment unit 330, a lock and free unit 370, and the holding part 380.

The base part 310 of the contact arm 300 is connected to the first movable head 122 through a Z-direction actuator 124. Note that, as illustrated in FIG. 7, two contact arms 300 share one base part 310 in this example. However, for example, each contact arm 300 may have a separate base part 310 without being particularly limited to the above example.

A housing 311 is fixed to the bottom of the base part 310. As illustrated in FIG. 8, the floating unit 320, the adjustment unit 330, and the lock and free unit 370 are housed in the housing 311.

The floating unit 320 includes two plates 321 and 322, three struts 323 to 325, and a connection shaft 326. The first to third struts 323 to 325 are provided between the first and second plates 321 and 322, and the two plates 321 and 322 are connected to each other by the three struts 323 to 325.

As illustrated in FIG. 9, the first strut 323 is disposed on the lower right side in the drawing of the second plate 322, while the second strut 324 is disposed on the upper left side in the drawing of the second plate 322. The first and second struts 323 and 324 are disposed on the same diagonal line of the second plate 322. On the other hand, the third strut 325 is disposed approximately at the center of the second plate 322.

Note that, as will be described later, a first plate cam 344 of the adjustment unit 330 is in contact with the first strut 323, a second plate cam 354 of the adjustment unit 330 is in contact with the second strut 324, and a pressing block 364 of the adjustment unit 330 is in contact with the third strut 325.

As illustrated in FIG. 8, ball bearings 313 are interposed between the second plate 322 of the floating unit 320 and an inner bottom surface 312 of the housing 311. Accordingly, the floating unit 320 is held by the housing 311 in a floating state on the plane substantially parallel to the inner bottom surface 312 (hereinafter, simply referred to as an "XY plane") and can therefore perform horizontal movement and rotation on the XY plane.

In addition, the connection shaft 326 is fixed to the bottom surface of the second plate 322 of the floating unit 320. The connection shaft 326 extends downward through an opening 314 formed on the inner bottom surface 312 of the housing 311, and the lower end of the connection shaft 326 is connected to the holding part 380. Accordingly, the holding part 380 can perform planar movement and rotation relative to the base part 310 to which the housing 311 is fixed. Note that ball bearings 316 are interposed between an outer bottom surface 315 of the housing 311 and a top surface of the holding part 380.

As illustrated in FIGS. 8 and 9, the adjustment unit 330 includes three adjustment portions 340 to 360 and is a mechanism for making the floating unit 320 perform horizontal movement and rotation on the XY plane according to the operation of the operation unit 230.

The first adjustment portion 340 includes a first input lever 341, the first cam follower 342, a first shaft 343, the first plate cam 344, and a first spring 345.

The first cam follower 342 protruding toward the housing 311 is attached to one end of the first input lever 341. The first cam follower 342 is rotatably held on the first input lever 341. The first cam follower 342 follows the cam surface 244 of the first translating cam 243 of the above-mentioned operation unit 230.

On the other hand, one end of the first shaft 343 is connected to the other end of the first input lever 341. The first shaft 343 enters the inside of the housing 311 through a through hole 318 formed on a side surface 317 of the housing 311 and is rotatably held by the housing 311 through a bearing (not illustrated in particular).

The first plate cam 344 is fixed to the other end of the first shaft 343. The first plate cam 344 has an approximately egg-shaped outer peripheral surface and is in contact with the first strut 323 of the floating unit 320.

As illustrated in FIG. 9, the first spring 345 is interposed between the housing 311 and the floating unit 320. The first spring 345 is a tension spring that biases the first strut 323 of the floating unit 320 toward the first plate cam 344. By the first spring 345, the first plate cam 344 and the first strut 323 are always in contact with each other, and the first input lever 341 is biased in the clockwise direction in FIG. 8 through the first shaft 343.

The first adjustment portion 340 operates as follows.

That is, when the first cam follower 342 rolls on the cam surface 244 of the first translating cam 243 to push up the first input lever 341, the first plate cam 344 rotates in the counterclockwise direction in FIG. 8 through the first shaft 343 to press the first strut 323 in the left direction (−X direction) in FIG. 8.

On the other hand, when the pressing force of the first plate cam 344 with respect to the first strut 323 is removed, the first strut 323 moves in the right direction (+X direction) in FIG. 8 due to the elastic force of the first spring 345, and the first input lever 341 rotates in the clockwise direction in FIG. 8 through the first shaft 343.

Similarly to the first adjustment portion 340, the second adjustment portion 350 also includes a second input lever 351, the second cam follower 352, a second shaft 353, the second plate cam 354, and a second spring 355.

The second cam follower 352 is attached to the second input lever 351 so as to protrude in a direction away from the housing 311 and follows the cam surface of the second translating cam 253 of the operation unit 230. The second plate cam 354 is in contact with the second strut 324 of the floating unit 320.

As illustrated in FIG. 9, the second spring 355 is a tension spring that biases the second strut 324 of the floating unit 320 toward the second plate cam 354, and is interposed between the housing 311 and the floating unit 320. By the second spring 355, the second plate cam 354 and the second strut 324 are always in contact with each other, and the second input lever 351 is biased in the clockwise direction in FIG. 8 through the second shaft 353.

The second adjustment portion 350 operates as follows.

That is, when the second cam follower 352 rolls on the cam surface of the second translating cam 253 to push up the second input lever 351, the second plate cam 354 rotates in the counterclockwise direction in FIG. 8 through the second shaft 353 to press the second strut 324 in the right direction (+X direction) in FIG. 8.

On the other hand, when the pressing force of the second plate cam 354 with respect to the second strut 324 is removed, the second strut 324 moves in the left direction (−X direction) in FIG. 8 due to the elastic force of the second spring 355, and the second input lever 351 rotates in the clockwise direction in FIG. 8 through the second shaft 353.

Similarly to the first and second adjustment portions 340 and 350, the third adjustment portion 360 also includes a third input lever 361, the third cam follower 362, a third shaft 363, and a third spring 365. However, the third adjustment portion 360 includes the pressing block 364 instead of the plate cams 344 and 354.

The third cam follower 362 is attached to one end of the third input lever 361 so as to protrude downward and follows the cam surface of the third translating cam 263 of the operation unit 230. The pressing block 364 fixed to the end of the third shaft 363 is in contact with the third strut 325 of the floating unit 320.

As illustrated in FIG. 9, the third spring 365 is a compression spring that biases the third strut 325 of the floating unit 320 toward the pressing block 364, and is interposed between the housing 311 and the floating unit 320. By the third spring 365, the pressing block 364 and the third strut 325 are always in contact with each other, and the third input lever 361 is biased in the downward direction (−Y direction) in FIG. 9 through the third shaft 363.

The third adjustment portion 360 operates as follows.

That is, when the third cam follower 362 rolls on the cam surface of the third translating cam 263 to press the third input lever 361 in the upward direction (+Y direction) in FIG. 9, the third strut 325 is also pressed in the upward direction (+Y direction) in FIG. 9 through the third shaft 363 and the third pressing block 364.

On the other hand, when the pressing force of the pressing block 364 with respect to the third strut 325 is removed, the third strut 325 moves in the downward direction (−Y direction) in FIG. 9 due to the elastic force of the third spring 365, and the third input lever 361 also moves in the downward direction (−Y direction) in FIG. 9 through the third shaft 363.

In the adjustment unit 330 described above, it is possible to move the floating unit 320 horizontally on the XY plane or rotate the floating unit 320 on the XY plane, for example, by operating the first and second input levers 341 and 351. Further, the floating unit 320 can be horizontally moved in the Y direction by pressing the third input lever 361.

As illustrated in FIGS. 8 and 10, the lock and free unit 370 of the contact arm 300 includes first and second air cylinders 371 and 373, receiving portions 375, and steel balls 376. As illustrated in FIG. 10, two first air cylinders 371 are disposed along the Y direction, and two second air cylinders 373 are disposed along the X direction.

Each first air cylinder 371 includes a piston 372 that can be in contact with the first plate 321 of the floating unit 320. The first air cylinder 371 can restrain the movement of the floating unit 320 by pressing the first plate 321 with the piston 372 and can release the restraint of the floating unit 320 by weakening the pressure of the piston 372.

In addition, the receiving portion 375 having a concave curved surface is provided on the first plate 321 of the floating unit 320. The steel ball 376 is placed on the receiving portion 375, and a piston 374 of the second air cylinder 373 is in contact with the steel ball 376 from above.

When the piston 374 of the second air cylinder 373 presses the steel ball 376, the floating unit 320 moves relative to the housing 311 so that a central portion of the curved surface of the receiving portion 375 faces the steel ball 376. Accordingly, the holding part 380 is centered with respect to the base part 310, and the relative position of the holding part 380 with respect to the base part 310 returns to the initial state (initialized).

As illustrated in FIG. 8, the holding part 380 of the contact arm 300 includes a suction pad 381. The suction pad 381 is opened at the approximate center of the lower end of the holding part 380 and connected to a vacuum pump (not illustrated) through a passage formed in the holding part 380. Accordingly, it is possible to adsorb and hold the DUT 10A.

Note that, although not illustrated in particular, a temperature adjusting mechanism for controlling the temperature of the DUT 10A, a temperature sensor for measuring the temperature of the DUT 10A, and the like may be embedded in the holding part 380.

Figure 11:
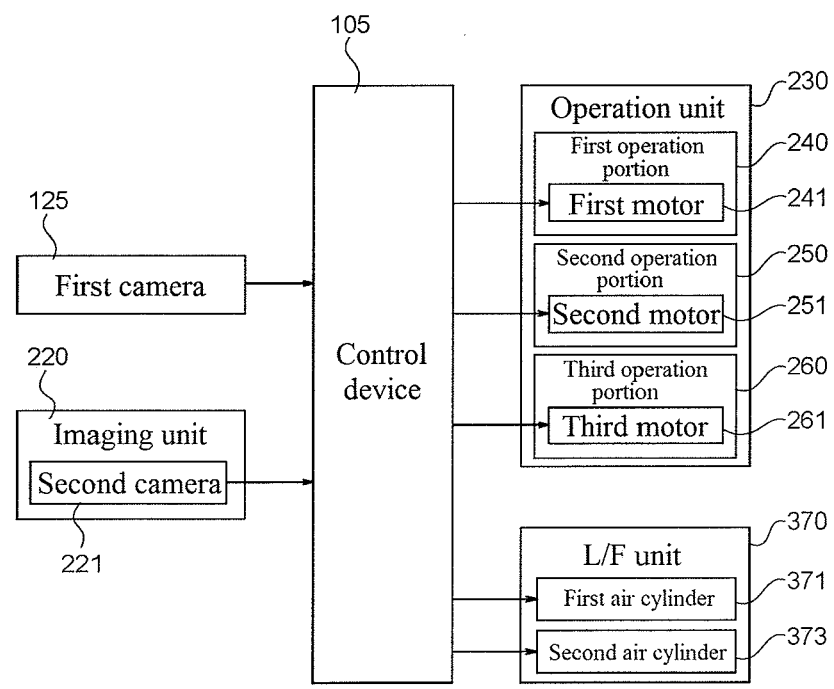
FIG. 11 is a block diagram illustrating a part of a control system of a handler in the first embodiment of the present invention.

FIG. 11 is a block diagram illustrating a control system of the handler in the present embodiment.

As illustrated in FIG. 11, the imaging unit 220, the operation unit 230, and the lock and free unit 370 described above are connected to a control device 105 of the handler 100 and controlled by the control device 105. Note that the control device 105 controls the entire handler 100 which includes the contact arms 300 and the alignment devices 200.

Specifically, the first camera 125 provided in the second transport device 120 can image the socket 410 of the test head 400 and then transmit the image information to the control device 105. Similarly, the second camera 221 of the imaging unit 220 can also image the DUT 10A placed on the first Y-direction buffer 160 and then transmit the image information to the control device 105.

The control device 105 includes, for example, a computer including a CPU, a RAM, a ROM, and the like, and has a function of performing image processing on image information. The control device 105 can recognize the position and orientation (hereinafter, also simply referred to as a "socket position") of the contact pins 411 of the socket 410 by performing image processing on the image information acquired by the first camera 125.

Note that, recognition of the socket position is performed, for example, when the socket 410 is replaced due to changes in the kind of the DUTs 10A and the like. The socket position is used in step S45 of FIG. 12, which will be described later.

In addition, the control device 105 can recognize the position and orientation (hereinafter, also simply referred to as a "first terminal position") of the first terminals 12 of the DUT 10A by performing image processing on image information acquired by the second camera 221.

Specifically, when the image information acquired by the second camera 221 is image information of the DUT 10A held by the holding part 380, the control device 105 recognizes the first terminal position from the image information. The first terminal position is recognized in step S44 of FIG. 12 and is used in step S45 of FIG. 12 which will be described later.

In addition, on the basis of the recognition result described above, the control device 105 can calculate the relative movement amount of the holding part 380 with respect to the base part 310 and further calculate the amount of driving of the operation unit 230 for realizing the relative movement amount.

Specifically, when the contact arm 300 presses the DUT 10A against the socket 410, the control device 105 calculates the relative movement amount (first correction amount $\Delta AL_1$ ($\Delta AL_1=(\Delta X_{AL1}, \Delta Y_{AL1}, \Delta \theta_{AL1})$ to be described later) for matching the socket position and the first terminal position relative to each other and further calculates the amount of driving of the operation unit 230 for realizing the relative movement amount. Then, the first to third motors 241, 251, and 261 of the operation unit 230 operate by the amount of driving specified by the control device 105. As a result, the DUT 10A is positioned relative to the socket 410.

Next, a method of testing the DUTs 10A using the alignment device 200 in the present embodiment will be described with reference to FIGS. 12 to 17.

Although a method of testing the DUTs 10A using the first movable head 122 will be described below, a method of testing the DUTs 10A using the second movable head 123 is the same and accordingly explanation thereof will be omitted.

Figure 12:
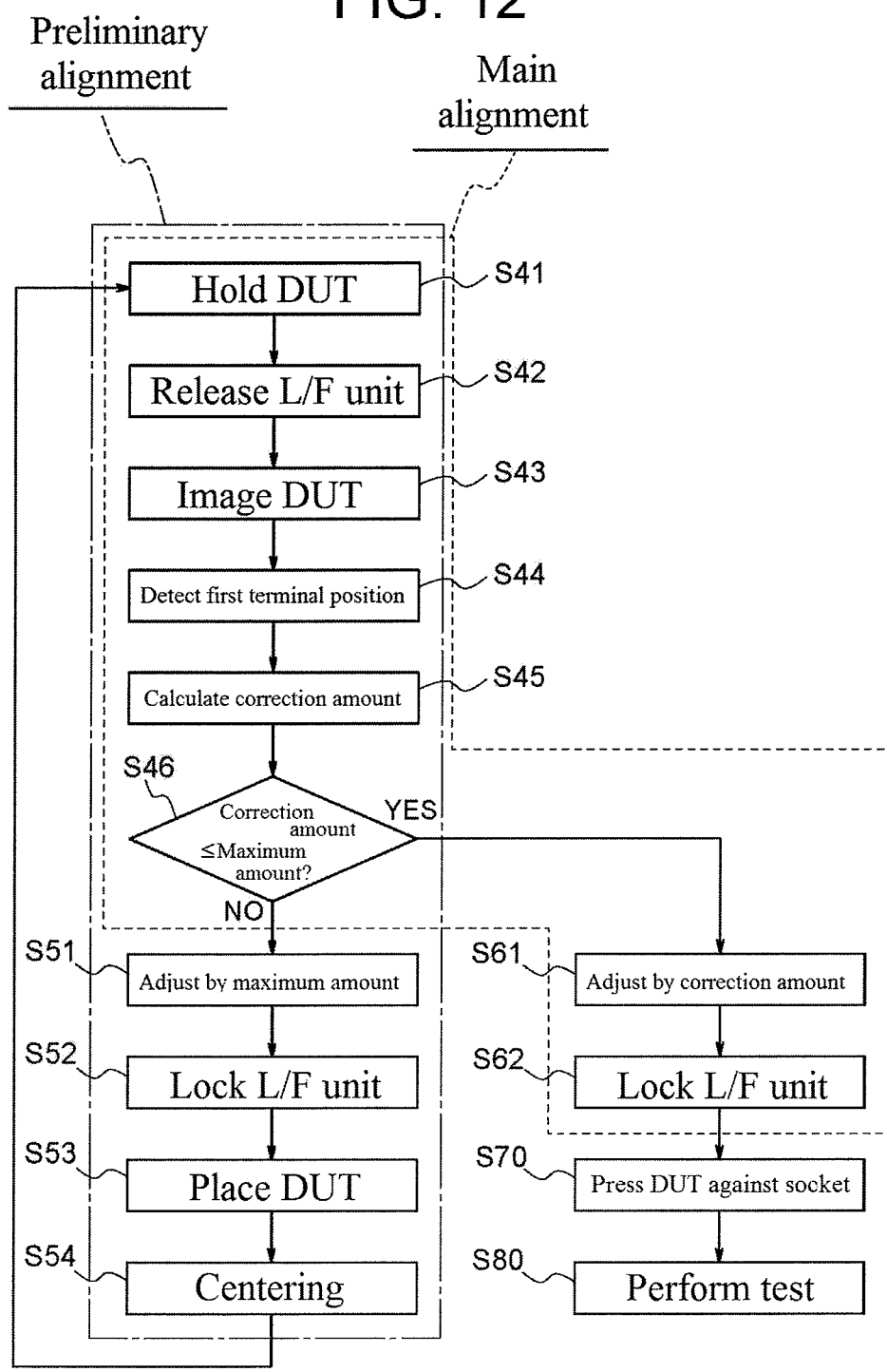
FIG. 12 is a flowchart illustrating an electronic component testing method in the first embodiment of the present invention.
Figure 14:
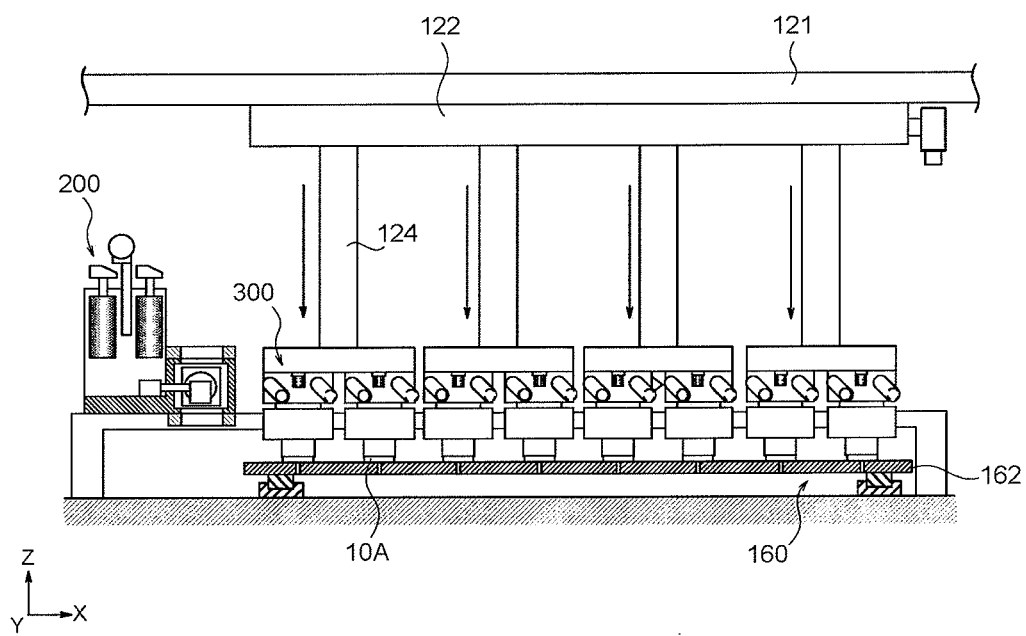
FIG. 14 is a view illustrating contact arms and an alignment device in step S41 of FIG. 12.
Figure 15:
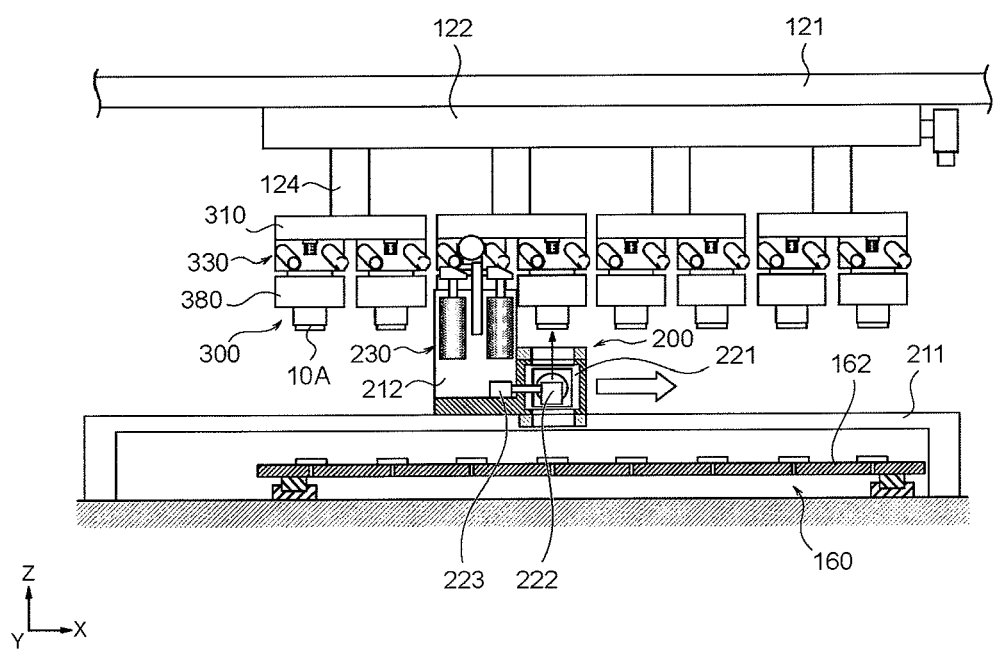
FIG. 15 is a view illustrating contact arms and an alignment device in steps S43 to S46, S51, and S61 of FIG. 12.
Figure 16A:
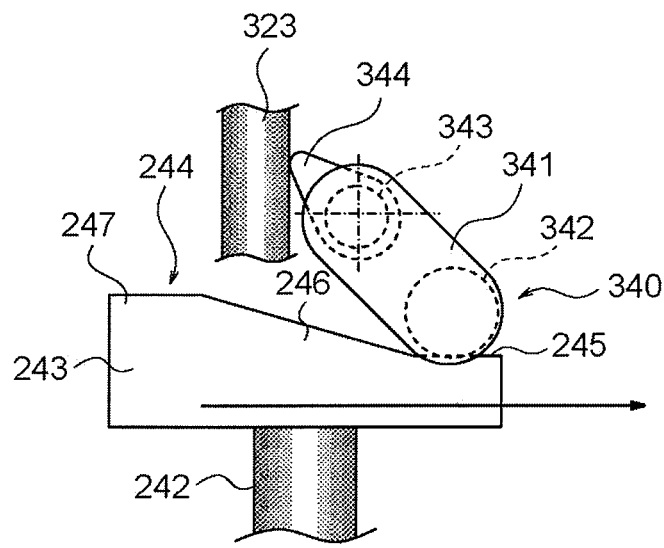
FIGS. 16A and 16B are enlarged views of an operation unit and an adjustment unit in steps S51 and S61 of FIG. 12.
Figure 16B:
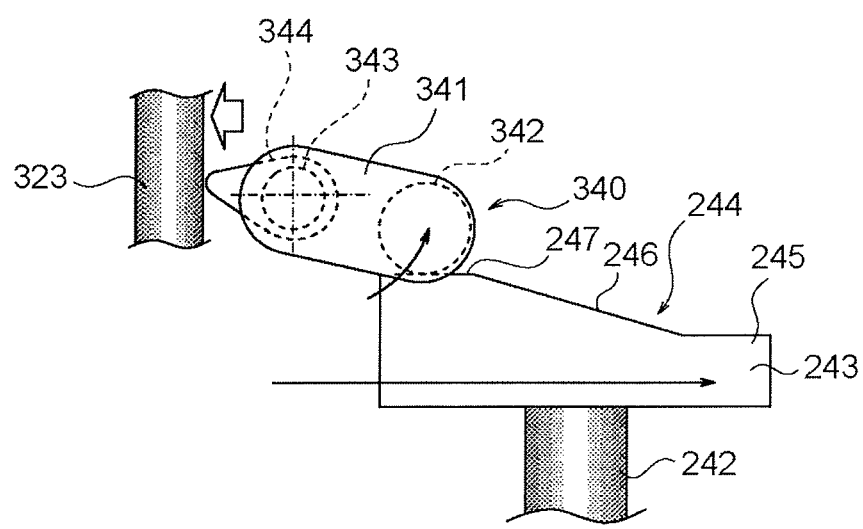
Figure 17:
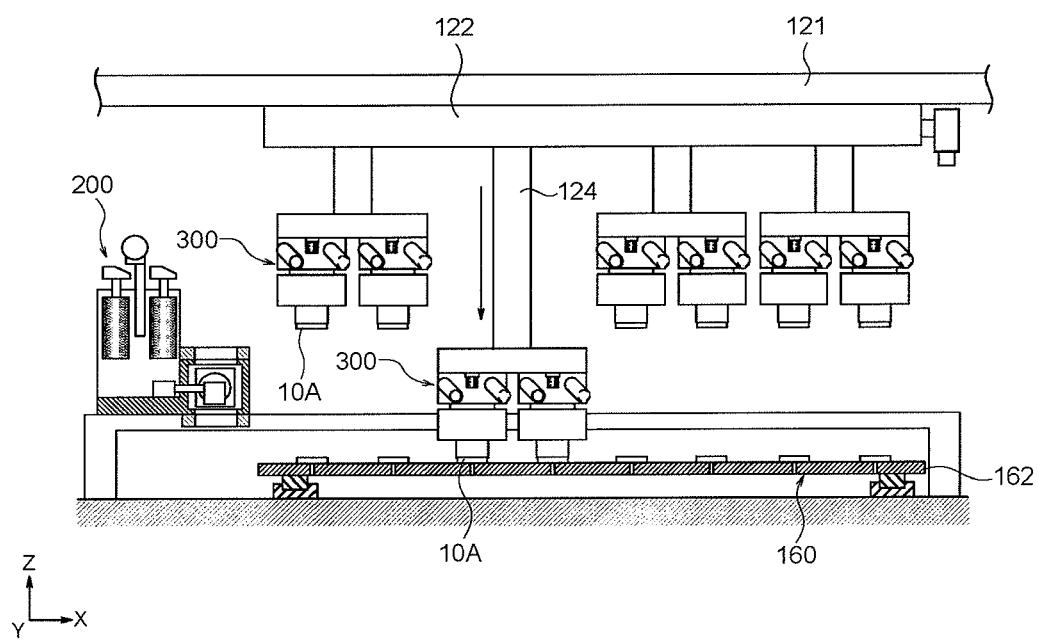
FIG. 17 is a view illustrating contact arms and an alignment device in step S53 of FIG. 12.

FIG. 12 is a flowchart for describing the DUT testing method in the present embodiment. FIGS. 13A to 13H are views illustrating the alignment operation in each step of FIG. 12. FIGS. 14, 15, and 17 are views illustrating contact arms and an alignment device in each step of FIG. 12. FIGS. 16A and 16B are enlarged views of an operation unit and an adjustment unit in steps S51 and S61 of FIG. 12.

First, in step S41 of FIG. 12, as illustrated in FIG. 13A and FIG. 14, the Z-direction actuator 124 extends to lower each contact arm 300, which adsorbs and holds the DUT 10A from the first Y-direction buffer 160. Once the DUT 10A is adsorbed and held, the Z-direction actuator 124 is shortened to raise the contact arm 300. Before holding the DUT 10A, the holding part 380 is centered with respect to the base part 310 by supplying air to the second air cylinder 373 of the lock and free unit 370.

Then, in step S42 of FIG. 12, the control device 105 releases the first air cylinder 371 of the lock and free unit 370 to make the holding part 380 not restrained with respect to the base part 310.

Then, as illustrated in FIG. 15, the process of steps S43 to S62 described below is performed for all the contact arms 300 of the first movable head 122 while moving the slide portion 212 of the alignment device 200 along the X direction.

First, in step S43 of FIG. 12, as illustrated in FIG. 13B, the DUT 10A in a state of being held by the holding part 380 is imaged by the second camera 221 of the imaging unit 220.

Then, in step S44 of FIG. 12, the control device 105 recognizes the first terminal position by performing image processing on the image information.

Then, in step S45 of FIG. 12, the control device 105 calculates a first correction amount $\Delta AL_1$ for the position of the holding part 380 on the basis of the first terminal position and the socket position which is preliminarily recognized. As described above, the first correction amount $\Delta AL_1$ is a necessary positional correction amount for the holding part 380 in order to relatively position the DUT 10A held by the holding part 380 with respect to the socket 410 of the test head 400.

Then, in step S46 of FIG. 12, the control device 105 determines whether or not the first correction amount $\Delta AL_1$ is a maximum alignment amount $AL_{max}$ of the alignment device 200 or less ($\Delta AL_1 \leq AL_{max}$). The determination in step S46 is performed for each component of the first correction amount $\Delta AL_1$. That is, a determination is made whether or not the X component $\Delta X_{AL1}$ of the first correction amount $\Delta AL_1$ is the X component $X_{ALmax}$ of the maximum alignment amount $AL_{max}$ or less, a determination is made whether or not the Y component $\Delta Y_{AL1}$ of the first correction amount $\Delta AL_1$ is the Y component $Y_{ALmax}$ of the maximum alignment amount $AL_{max}$ or less, and a determination is made whether or not the $\theta$ component $\Delta \theta_{AL1}$ of the first correction amount $\Delta AL_1$ is the $\theta$ component $\theta_{ALmax}$ of the maximum alignment amount $AL_{max}$ or less. Then, when all the components $\Delta X_{AL1}$, $\Delta Y_{AL1}$, and $\Delta \theta_{AL1}$ of the first correction amount $\Delta AL_1$ satisfy the conditions, a determination is made that the first correction amount $\Delta AL_1$ is the maximum alignment amount $AL_{max}$ or less ("YES" in step S46, i.e., $\Delta AL_1 \leq AL_{max}$). On the other hand, when at least one of the components $\Delta X_{AL1}$, $\Delta Y_{AL1}$, and $\Delta \theta_{AL1}$ of the first correction amount $\Delta AL_1$ does not satisfy the conditions, a determination is made that the first correction amount $\Delta AL_1$ is larger than the maximum alignment amount $AL_{max}$ ("NO" in step S46, i.e., $\Delta AL_1 > AL_{max}$).

With regard to contact arms 300 for which a determination is made in step S46 that the first correction amount $\Delta AL_1$ is the maximum alignment amount $AL_{max}$ or less ("YES" in step S46, i.e., $\Delta AL_1 \leq AL_{max}$), the control device 105 calculates, in step S61 of FIG. 12, the amount of driving of the operation unit 230 for realizing the first correction amount $\Delta AL_1$ and gives an instruction regarding the amount of driving to the operation unit 230 of the alignment device 200. The operation unit 230 operates the adjustment unit 330 of the contact arm 300 on the basis of the instruction from the control device 105 to move the holding part 380 by the first correction amount $\Delta AL_1$.

Here, the operation of the adjustment unit 330 by the operation unit 230 will be described with reference to an example. For example, as illustrated in FIGS. 16A and 16B, when the first input lever 341 is pushed up by the inclined surface 246 of the first translating cam 243 in a state where the first translating cam 243 is positioned at a predetermined height by the first motor 241 on the basis of the instruction from the control device 105, the first strut 323 is pressed leftward in the drawings by the first plate cam 344.

Then, in step S62 of FIG. 12, the floating unit 320 is locked by supplying air to the first air cylinder 371 of the lock and free unit 370. Thus, the relative positioning of the DUT 10A with respect to the socket 410 is completed.

When a determination is made that the first correction amount $\Delta AL_1$ is the maximum alignment amount $AL_{max}$ or less ("YES" in step S46, i.e., $\Delta AL_1 \leq AL_{max}$) for all the contact arms 300 of the first movable head 122, the first movable head 122 moves to above the socket 410 of the test head 400 in step S70 of FIG. 12 and then the Z-direction actuator 124 extends to lower the first movable head 122, which presses the DUT 10A against the socket 410. This allows the first terminals 12 of the DUT 10A to come into contact with the contact pins 411 of the socket 410 (refer to FIG. 8). In this state, in step S80 of FIG. 12, the test head 400 and the tester 500 input and output test signals with respect to the DUT 10A to perform the test of the DUT 10A.

On the other hand, when a determination is made in step S46 that there is a contact arm 300 for which the first correction amount $\Delta AL_1$ is larger than the maximum alignment amount $AL_{max}$ (hereinafter, also simply referred to as an "over-range contact arm") ("NO" in step S46, i.e., $\Delta AL_1 > AL_{max}$), the process of steps S51 to S54 of FIG. 12 is performed for the over-range contact arm 300.

Specifically, in step S51 of FIG. 12, as illustrated in FIG. 13C, the control device 105 drives the operation unit 230 of the alignment device 200 to move the holding part 380 by the maximum alignment amount $AL_{max}$ via the adjustment unit 330 of the contact arm 300.

Then, in step S52 of FIG. 12, the floating unit 320 is locked by supplying air to the first air cylinder 371 of the lock and free unit 370.

Then, in step S53 of FIG. 12, as illustrated in FIG. 13D and FIG. 17, the Z-direction actuator 124 extends to lower the contact arm 300, which once places the DUT 10A on the first Y-direction buffer 160. As described above, in the present embodiment, two contact arms 300 share one base part 310. In FIG. 17, therefore, two contact arms 300 are lowered, but only the over-range contact arm 300 performs the operation to place the DUT 10A, and the contact arm 300, which is not an over-range contact arm, continues to hold the DUT 10A.

Then, in step S54 of FIG. 12, the control device 105 first releases the first air cylinder 371 of the lock and free unit 370 to make the holding part 380 not restrained with respect to the base unit 310. Then, the control device 105 supplies air to the second air cylinder 373 of the lock and free unit 370 to center the holding part 380 with respect to the base part 310, as illustrated in FIG. 13E, and thereafter supplies air to the first air cylinder 371 of the lock and free unit 370 to lock the floating unit 320.

The routine then returns to step S41 of FIG. 12 in which, as illustrated in FIG. 13F, the over-range contact arm 300 holds the DUT 10A and, in step S42 of FIG. 12, the control device 105 makes the lock and free unit 370 of the over-range contact arm 300 not restrained.

Then, the above-described process of steps S43 to S62 is performed again only for the over-range contact arm 300 while moving the slide portion 212 of the alignment device 200 along the X direction. Before starting these steps S43 to S62, the slide portion 212 of the alignment device 200 is returned in –X direction.

Specifically, in step S43 of FIG. 12, as illustrated in FIG. 13G, the second camera 221 images the DUT 10A. Then, in step S44 of FIG. 12, the control device 105 recognizes the first terminal position by performing image processing on the image information. Then, in step S45 of FIG. 12, the control device 105 calculates a first correction amount $\Delta AL_1'$.

When step S43 of the first round is performed, step S43 of the second and subsequent rounds may be omitted. In this case, the newest first correction amount $\Delta AL_1'$ is calculated by subtracting the maximum alignment amount $AL_{max}$ of step S51 from the first correction amount $\Delta AL_1$ calculated in step S45 of the first round.

Then, in step S46 of FIG. 12, the control device 105 determines whether or not the first correction amount $\Delta AL_1'$ is the maximum alignment amount $AL_{max}$ or less ($\Delta AL_1' \leq AL_{max}$).

With regard to contact arms 300 that are determined not to be over-range contact arms in step S46 ("YES" in step S46, i.e., $\Delta AL_1' \leq AL_{max}$), the control device 105 drives the operation unit 230 of the alignment device 200, in step S61 of FIG. 12, to move the holding part 380 by the first correction amount $\Delta AL_1'$ via the adjustment unit 330 of the contact arm 300, as illustrated in FIG. 13H.

Then, in step S62 of FIG. 12, the floating unit 320 is locked by supplying air to the first air cylinder 371 of the lock and free unit 370. Then, when all the contact arms 300 provided at the first movable head 122 are not over-range contact arms, the previously-described steps S70 and S80 (pressing step and testing step) are performed.

On the other hand, when one or more over-range contact arms 300 remain, the above process is repeated until there are no contact arms 300 that are determined as over-range contact arms in step S46 of FIG. 12.

As the above, in the present embodiment, when there are one or more over-range contact arms, the preliminary alignment work (steps S41 to S46 and S51 to S54 of FIG. 12) is performed at least once, while when there are no over-range contact arms, the main alignment work (steps S41 to S46 and S61 to S62 of FIG. 12) is performed. Thus, even when the first correction amount $\Delta AL_1$ for the DUTs 10A exceeds the maximum alignment amount $AL_{max}$ of the alignment device ($\Delta AL_1 > AL_{max}$), the main alignment work can be performed and it is therefore possible to improve the operation rate of the electronic component handling apparatus.

«Second Embodiment»

Figure 18:
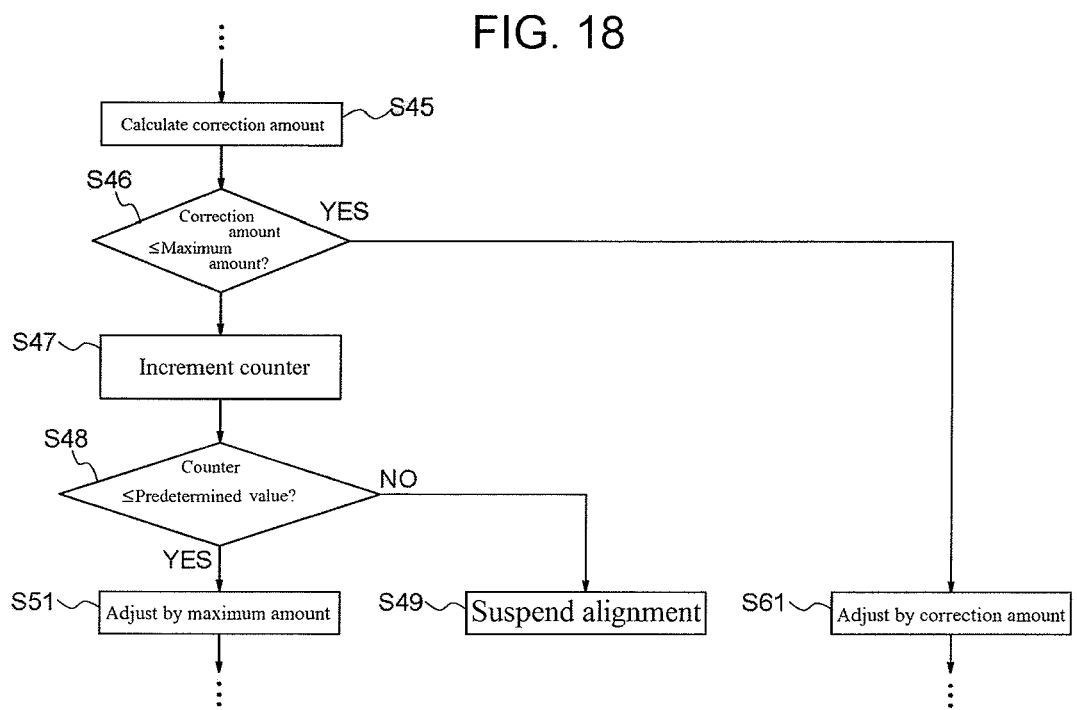
FIG. 18 is a diagram illustrating a featured part of a flowchart for describing a DUT testing method in a second embodiment of the present invention.

FIG. 18 is a diagram illustrating a featured part of a flowchart for describing the DUT testing method in a second embodiment of the present invention.

The testing method in the present embodiment is perfoiiiied using the electronic component testing apparatus 1 described in the first embodiment. The testing method in the present embodiment is different from the first embodiment in that steps S47 to S49 of FIG. 18 are added, but other steps are the same as those in the first embodiment. Differences from the first embodiment will only be described below for the second embodiment, and the description of the same steps as those in the first embodiment will be omitted.

Specifically, when a determination is made in step S46 of FIG. 18 that there is an over-range contact arm ("NO" in step S46, i.e., $\Delta AL_1 > AL_{max}$), a counter n is incremented (n=n+1) in step S47 of FIG. 18. The counter n is reset (n=0) every time the testing step of step S80 of FIG. 18 is performed.

Then, in step S48 of FIG. 18, a determination is made whether or not the counter n is a predetermined value or less (n≤predetermined value). The predetermined value may be, for example, but is not limited to being, 10. The predetermined value is stored in the control device 105 and the user can freely set the value via an input device connected to the control device 105.

When, in step S48, a determination is made that the counter n is the predetermined value or less ("YES" in step S48, i.e., n≤predetermined value), the process of steps S51 to S54 described in the first embodiment is performed for the over-range contact arm 300.

On the other hand, when, in step S48, a determination is made that the counter n is larger than the predetermined value ("NO" in step S48, i.e., n>predetermined value), the alignment of the over-range contact arm 300 is forcibly suspended in step S49 of FIG. 18. Steps S70 and S80 of FIG. 18 are not performed for this over-range contact arm 300.

In the present embodiment, similarly to the first embodiment, when there are one or more over-range contact arms, the preliminary alignment work is performed at least once, while when there are no over-range contact arms, the main alignment work is performed. Thus, even when the first correction amount $\Delta AL_1$ for the DUTs 10A exceeds the maximum alignment amount $AL_{max}$ of the alignment device, the main alignment work can be performed and it is therefore possible to improve the operation rate of the electronic component handling apparatus.

Moreover, in the present embodiment, when the number of executions of the preliminary alignment work comes to the predetermined value, the alignment of the over-range contact arm 300 is forcibly suspended. This can suppress the deterioration in the operation rate of the electronic component handling apparatus due to repetition of the preliminary alignment work.

«Third Embodiment»

Figure 19:
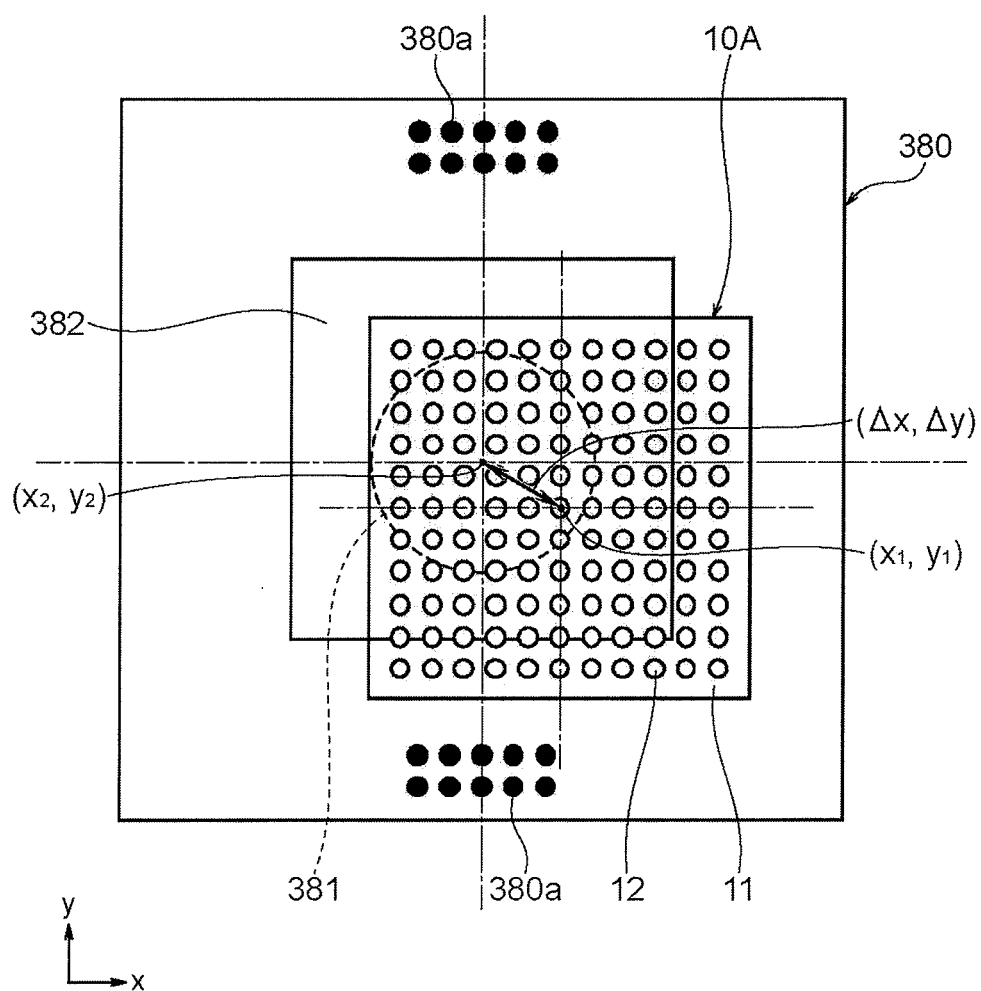
FIG. 19 is a view illustrating an image when a holding part of a contact arm and a DUT are imaged from below in a third embodiment of the present invention.
Figure 20A:
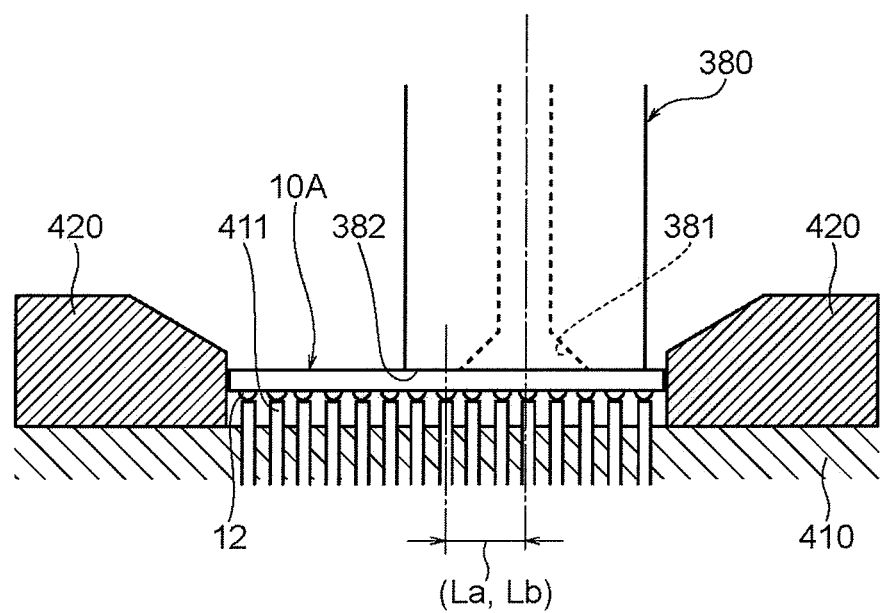
FIG. 20A is a view illustrating a state in which the DUT is pressed against a socket in the third embodiment of the present invention and FIG. 20B is a view illustrating a state in which a holding part of the contact arm is in contact with a socket guide in a comparative example.
Figure 20B:
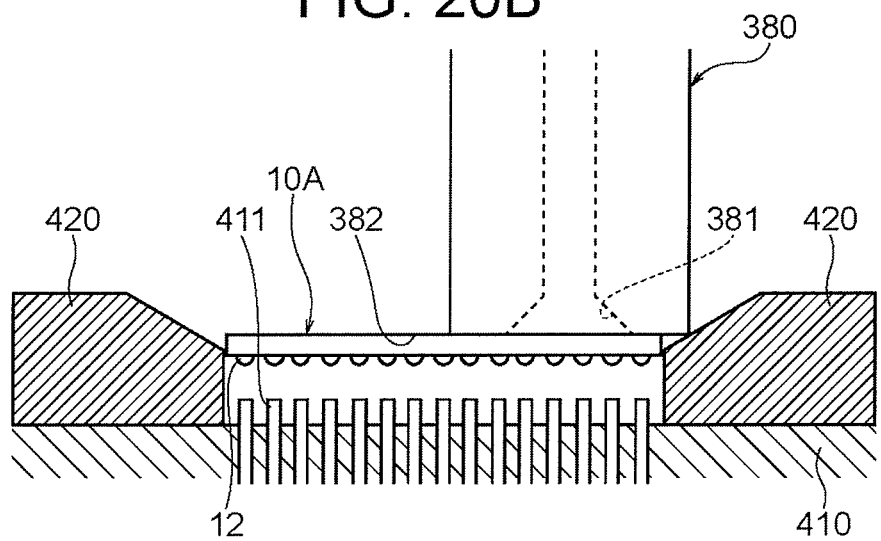

FIG. 19 is a view illustrating an image when the holding part of the contact arm and the DUT are imaged from below in a third embodiment of the present invention. FIG. 20A is a view illustrating a state in which the DUT is pressed against the socket in the third embodiment of the present invention. FIG. 20B is a view illustrating a state in which the holding part of the contact arm is in contact with a socket guide in a comparative example.

The testing method in the present embodiment is performed using the electronic component testing apparatus 1 described in the first embodiment. In the testing method of the present embodiment, the contents of steps S45, S46, and S51 of FIG. 12 are different from those in the first embodiment, but other steps are the same as those in the first embodiment. Differences from the first embodiment will only be described below for the third embodiment, and the description of the same steps as those in the first embodiment will be omitted.

In the present embodiment, in step S45 of FIG. 12, a center-to-center distance ($\Delta x, \Delta y$) is calculated in addition to the first correction amount $\Delta AL_1$. Specifically, image processing is performed on the image information imaged by the second camera 221 to recognize not only the first terminal position but also the position and orientation (hereinafter, also simply referred to as a "tip position") of a tip 382 of the holding part 380 of the contact arm 300. During this operation, as illustrated in FIG. 19, the position and orientation of the tip 382 are recognized on the basis of markers 380a provided on the holding part 380. Then, the control device 105 calculates center coordinate values ($x_1, y_1$) of the DUT 10A on the basis of the first terminal position, calculates center coordinate values ($x_2, y_2$) of the tip 382 of the holding part 380 on the basis of the tip position, and further calculates the center-to-center distance ($\Delta x, \Delta y$) therebetween (($\Delta x, \Delta y$)=($x_1-x_2, y_1-y_2$)).

Then, in step S46 of FIG. 12, the control device 105 determines whether or not the center-to-center distance ($\Delta x, \Delta y$) is a predetermined value ($L_a, L_b$) or less. The predetermined value ($L_a, L_b$) is a value that is preliminarily set on the basis of relevant parameters, such as the size of the DUT 10A and the size of the tip 382 of the holding part 380, so that the tip 382 of the holding part 380 does not fall outside (protrude from) the DUT 10A.

Then, when the center-to-center distance ($\Delta x, \Delta y$) is larger than the predetermined value ($L_a, L_b$) ("NO" in step S46, i.e., ($\Delta x, \Delta y$)>($L_a, L_b$)), the control device 105 drives the operation unit 230 of the alignment device 200 in step S51 of FIG. 12 to move the holding part 380 so that the center-to-center distance ($\Delta x, \Delta y$) becomes the predetermined value ($L_a, L_b$) or less.

On the other hand, when the center-to-center distance ($\Delta x, \Delta y$) is the predetermined value ($L_a, L_b$) or less ("YES" in step S46, i.e., ($\Delta x, \Delta y$)≤($L_a, L_b$)), the control device 105 drives the operation unit 230 of the alignment device 200 in step S61, as in the first embodiment, to move the holding part 380 by the first correction amount $\Delta AL_1$ via the adjustment unit 330 of the contact arm 300.

In the present embodiment, when the tip 382 of the holding part 380 falls outside (protrudes from) the DUT 10A, the preliminary alignment work (steps S41 to S46 and S51 to S54 of FIG. 12) is performed at least once, while when the tip 382 of the holding part 380 falls within (is within) the DUT 10A, the main alignment work (steps S41 to S46 and S61 to S62 of FIG. 12) is performed. Thus, when the DUT 10A is pressed against the socket 410 as illustrated in FIG. 20A, the tip 382 of the holding part 380 falls within the DUT 10A and it is therefore possible to improve the operation rate of the electronic component handling apparatus.

In contrast, when the DUT 10A is pressed against the socket 410 while the tip 382 of the holding part 380 falls outside the DUT 10A as illustrated in FIG. 20B, the holding part 380 of the contact arm 300 may come into contact with a socket guide 420 to generate an alarm and shut down the electronic component handling apparatus.

In an alternative embodiment, the control device 105 may calculate a correction amount such that the tip 382 of the holding part 380 does not fall outside the DUT 10A, on the basis of the position, orientation and size of the DUT 10A and the position, orientation and size of the tip 382 of the holding part 380, and the operation unit 230 of the alignment device 200 may only rotate the holding part 380 on the basis of the correction amount. This allows to deal with a case in which the tip 382 of the holding part 380 falls outside the DUT 10A only due to the orientation of the DUT 10A.

«Fourth Embodiment»

Figure 21:
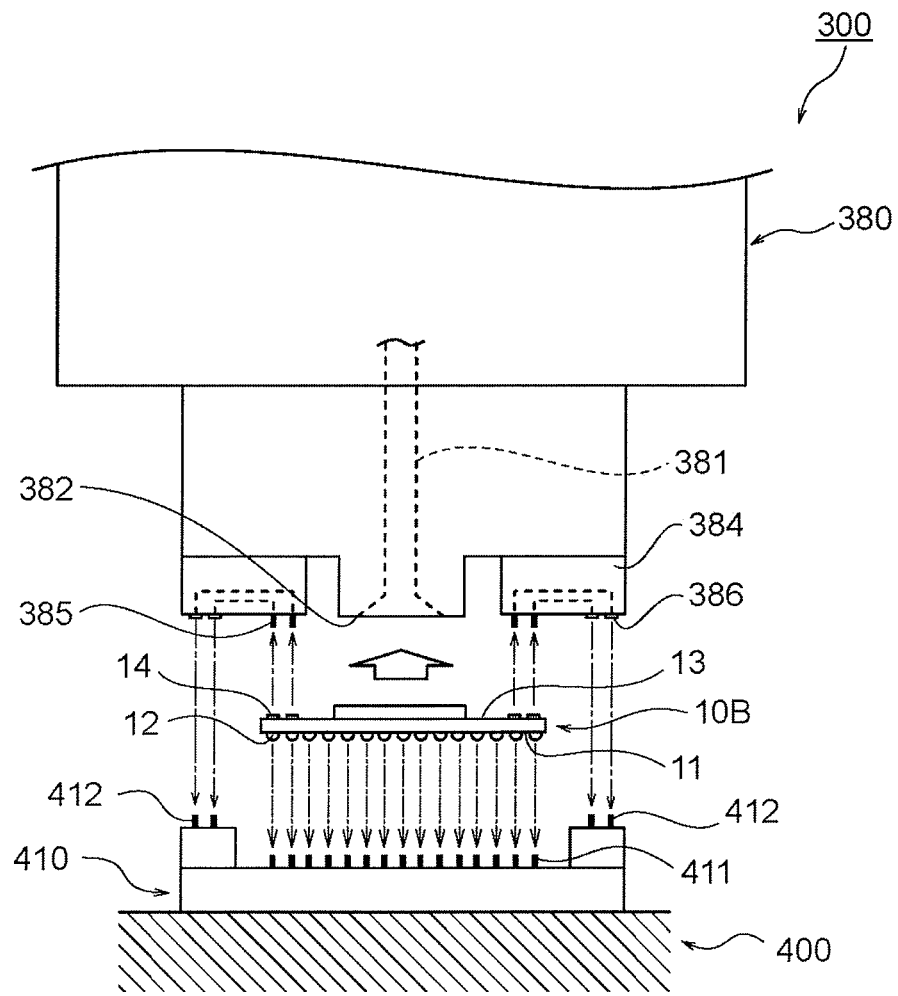
FIG. 21 is a view illustrating a tip portion of a contact arm in a fourth embodiment of the present invention.

FIG. 21 is a view illustrating a tip portion of the contact arm in a fourth embodiment of the present invention.

The electronic component testing apparatus in the present embodiment is different from the first embodiment in that a DUT 10B has second terminals 14 on the upper surface 13 of the DUT 10B and the contact arm 300 has an intermediate socket 384, but other configuration is the same as that in the first embodiment. With regard to the configuration of the electronic component testing apparatus in the fourth embodiment, differences from the first embodiment will only be described below, and the description of the same configuration as that in the first embodiment will be omitted by denoting the same reference numerals.

As illustrated in FIG. 21, the DUT 10B in the present embodiment has the second terminals 14 provided on the upper surface 13 in addition to the first terminals 12 provided on the bottom surface 11. Accordingly, the intermediate socket 384 is attached to the holding part 380 of the contact arm 300.

The intermediate socket 384 is attached to the lower part of the holding part 380 so as to surround the suction pad 381. The intermediate socket 384 has contact pins 385 and contact pads 386. The contact pins 385 are arranged to correspond to the second terminals 14 of the DUT 10B. The contact pads 386 are arranged to correspond to second contact pins 412 of the socket 410.

When the contact arm 300 presses the DUT 10B against the socket 410 during the test, the first terminals 12 of the DUT 10B come into contact with first contact pins 411 of the socket 410, the second terminals 14 of the DUT 10B come into contact with the contact pins 385 of the intermediate socket 384, and the contact pads 386 of the intermediate socket 384 come into contact with the second contact pins 412 of the socket 410. This allows the second terminals 14 of the DUT 10B to be electrically connected to the socket 410 via the intermediate socket 384.

The intermediate socket 384 is imaged by the second camera 221 of the imaging unit 220. Thus, the control device 105 can recognize not only the above-described first terminal position but also the position and orientation (hereinafter, also simply referred to as a "second terminal position") of the second terminals 14 of the DUT 10B or the position and orientation (hereinafter, also simply referred to as an "intermediate socket position") of the contact pins 385 and contact pads 386 of the intermediate socket 384 by performing image processing on the image information acquired by the second camera 221.

Specifically, when the image information acquired by the second camera 221 is image information of the DUT 10B placed on the moving plate 162 of the first Y-direction buffer 160 (i.e., the DUT 10B before being held by the contact arm 300), the control device 105 recognizes the second terminal position from the image information. The second terminal position is recognized in step S13 of FIG. 22 and is used in step S14 of FIG. 22 which will be described later.

On the other hand, when the image information acquired by the second camera 221 is image information of the holding part 380 before holding the DUT 10B, the control device 105 recognizes the intermediate socket position from the image information. Note that, recognition of the intermediate socket position is performed, for example, when the intermediate socket 384 is replaced due to changes in the kind of the DUTs 10B and the like. At this time, similarly to step S12 and S43 of FIG. 22 to be described later, a plurality of holding parts 380 is sequentially imaged while moving the imaging unit 220 by the moving unit 210. The intermediate socket position is used in step S14 of FIG. 22, which will be described later.

In addition, on the basis of the recognition result described above, the control device 105 can calculate the relative movement amount of the holding part 380 with respect to the base part 310 and further calculate the amount of driving of the operation unit 230 for realizing the relative movement amount.

Specifically, when the contact arm 300 holds the DUT 10B, the control device 105 calculates a relative movement amount (second correction amount $\Delta AL_2$ to be described later) for matching the second terminal position and the intermediate socket position relative to each other and further calculates the amount of driving of the operation unit 230 for realizing the relative movement amount. Then, the first to third motors 241, 251, and 261 of the operation unit 230 operate by the amount of driving specified by the control device 105. As a result, the intermediate socket 384 is positioned relative to the DUT 10B.

Next, a method of testing the DUTs 10B in the present embodiment will be described with reference to FIGS. 22 to 24.

Although a method of testing the DUTs 10B using the first movable head 122 will be described below, a method of testing the DUTs 10B using the second movable head 123 is the same and accordingly explanation thereof will be omitted.

Figure 22:
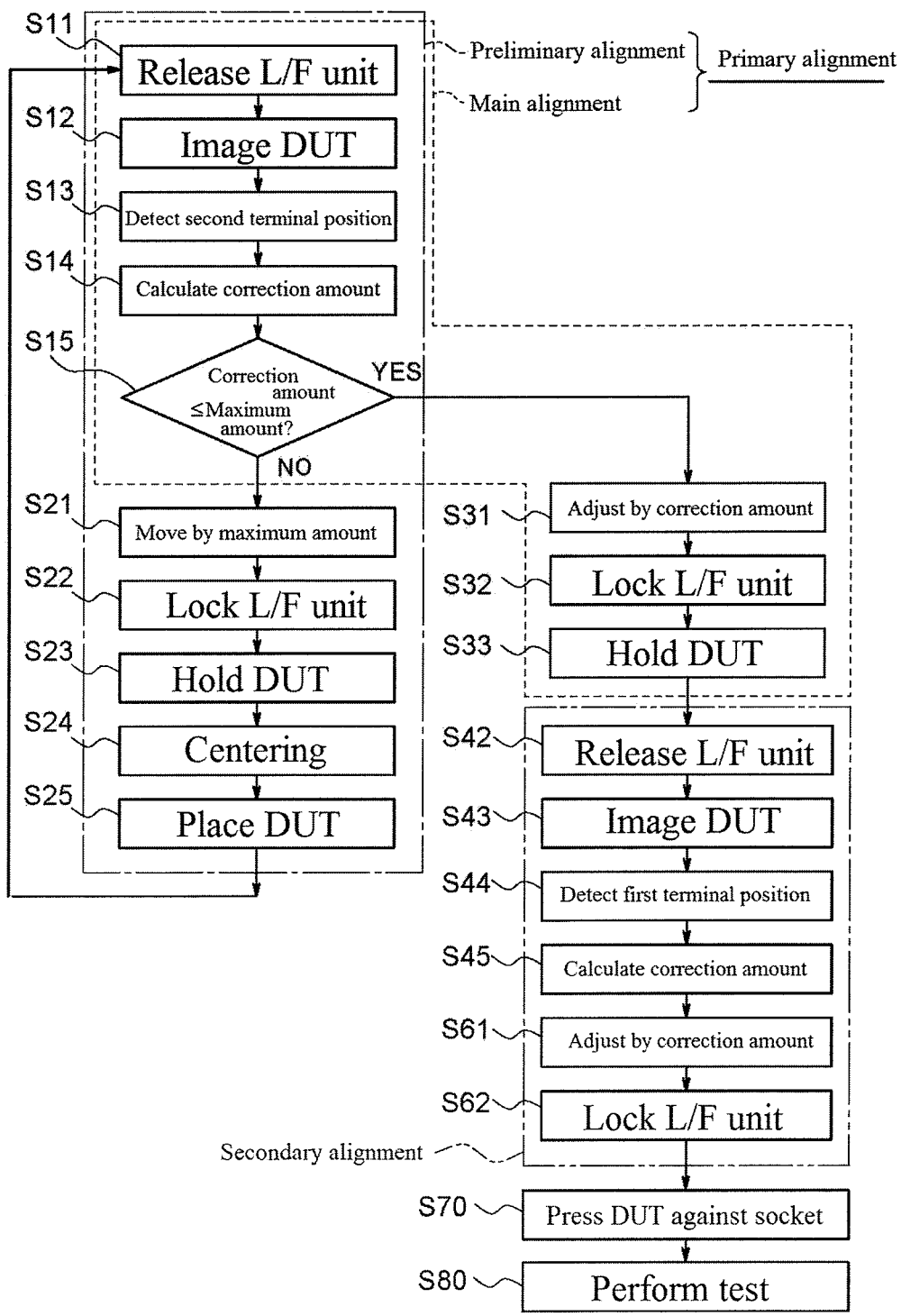
FIG. 22 is a flowchart illustrating an electronic component testing method in the fourth embodiment of the present invention.

FIG. 22 is a flowchart illustrating an electronic component testing method in the fourth embodiment of the present invention. FIG. 23 is a view illustrating contact arms and an alignment apparatus in steps S12 to S15, S21, and S31 of FIG. 22. FIGS. 24A to 24H are views illustrating the alignment operation in each step of FIG. 22.

In the present embodiment, as illustrated in FIG. 22, the intermediate socket 384 is relatively positioned to the DUT 10B by primary alignment (steps S11 to S33). Then, the DUT 10B is relatively positioned to the socket 410 by secondary alignment (steps S42 to S62) and thereafter pressed against the socket 410 by the contact arm 300 (step S70) and, in this state, the test head 400 and the tester 500 perform the test of the DUT 10B (step S80).

Specifically, in step S11 of FIG. 22, the control device 105 releases all the air cylinders 371 and 373 of the lock and free unit 370 to make the holding part 380 not restrained with respect to the base part 310.

Figure 23:
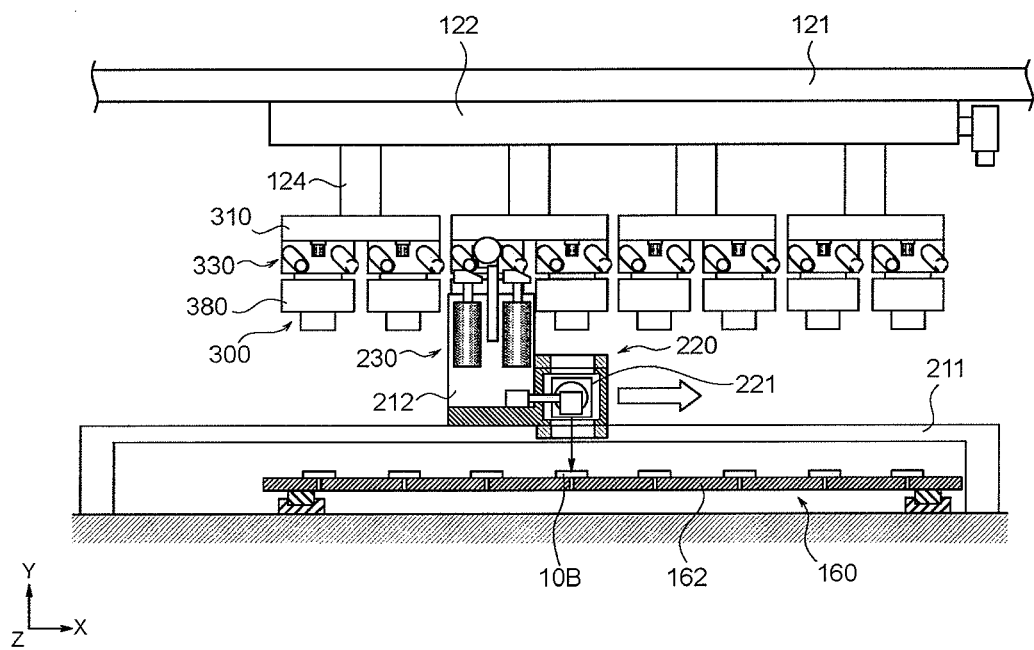
FIG. 23 is a view illustrating contact arms and an alignment apparatus in steps S12 to S15, S21, and S31 of FIG. 22.

Then, as illustrated in FIG. 23, the process of steps S12 to S33 described below is performed for all the contact arms 300 of the first movable head 122 while moving the slide portion 212 of the alignment device 200 along the X direction.

Figure 24A:
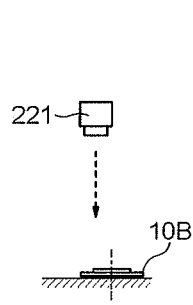
FIGS. 24A to 24H are views illustrating an alignment operation in each step of FIG. 22.

First, in step S12 of FIG. 22, as illustrated in FIG. 24A, the DUT 10B on the first Y-direction buffer 160 is imaged by the second camera 221 of the imaging unit 220.

Then, in step S13 of FIG. 22, the control device 105 recognizes the second terminal position by performing image processing on the image information.

Then, in step S14 of FIG. 22, the control device 105 calculates a second correction amount $\Delta AL_2$ for the position of the holding part 380 on the basis of the second terminal position and the intermediate socket position which is preliminarily recognized. As described above, the second correction amount $\Delta AL_2$ is a necessary positional correction amount for the holding part 380 in order to relatively position the DUT 10B with respect to the intermediate socket 384.

Then, in step S15 of FIG. 22, the control device 105 determines whether or not the second correction amount $\Delta AL_2$ is the maximum alignment amount $AL_{max}$ of the alignment devices 200 or less ($\Delta AL_2 \leq AL_{max}$).

With regard to contact arms 300 for which a determination is made in step S15 that the second correction amount $\Delta AL_2$ is the maximum alignment amount $AL_{max}$ or less ("YES" in step S15, i.e., $\Delta AL_2 \leq AL_{max}$), the control device 105 calculates, in step S31 of FIG. 22, the amount of driving of the operation unit 230 for realizing the second correction amount $\Delta AL_2$ and gives an instruction regarding the amount of driving to the operation unit 230 of the alignment devices 200. The operation unit 230 operates the adjustment unit 330 of the contact arm 300 on the basis of the instruction from the control device 105 to move the holding part 380 by the second correction amount $\Delta AL_2$.

Then, in step S32 of FIG. 22, the floating unit 320 is locked by supplying air to the first air cylinder 371 of the lock and free unit 370 and, in step S33 of FIG. 22, the contact arm 300 holds the DUT 10B. Thus, the relative positioning of the intermediate socket 384 with respect to the DUT 10B is completed.

When a determination is made that the second correction amount $\Delta AL_2$ is the maximum alignment amount $AL_{max}$ or less ("YES" in step S15, i.e., $\Delta AL_2 \leq AL_{max}$) for all the contact arms 300 of the first movable head 122, the process of steps S42 to S80 of FIG. 22 is performed. Steps S42 to S80 of FIG. 22 are the same as those of FIG. 12 described in the first embodiment and the description will be omitted. In the present embodiment, an over-range contact arm 300 no longer exists because of the primary alignment (steps S11 to S33 of FIG. 22, i.e., positioning of the DUT 10B with respect to the intermediate socket 384) and, therefore, the work of steps S46 to S54 described in the first embodiment is not performed in the secondary alignment (steps S42 to S62 of FIG. 22, i.e., positioning of the DUT 10B with respect to the socket 410).

On the other hand, when a determination is made in step S15 that there is a contact arm 300 for which the second correction amount $\Delta AL_2$ is larger than the maximum alignment amount $AL_{max}$ (i.e., an over-range contact arm 300) ("NO" in step S15, i.e., $\Delta AL_2 > AL_{max}$), the process of steps S21 to S25 of FIG. 22 is performed for the over-range contact arm 300.

Figure 24B:
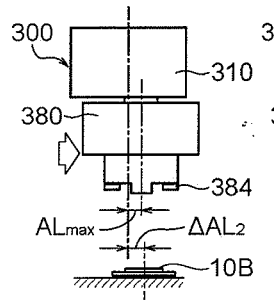

Specifically, in step S21 of FIG. 22, as illustrated in FIG. 24B, the control device 105 drives the operation unit 230 of the alignment device 200 to move the holding part 380 by the maximum alignment amount $AL_{max}$ via the adjustment unit 330 of the contact arm 300.

Then, in step S22 of FIG. 22, the floating unit 320 is locked by supplying air to the first air cylinder 371 of the lock and free unit 370.

Figure 24C:
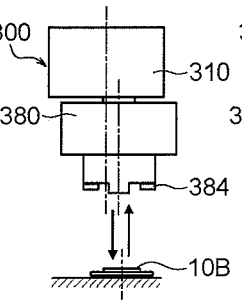

Then, in step S23 of FIG. 22, as illustrated in FIG. 24C, the Z-direction actuator 124 extends to lower the contact arm 300, which adsorbs and holds the DUT 10B. After the DUT 10B is adsorbed and held, the Z-direction actuator 124 is shortened to raise the contact arm 300.

Figure 24D:
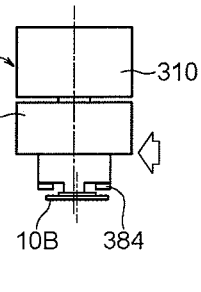

Then, in step S24 of FIG. 22, the control device 105 first releases the first air cylinder 371 of the lock and free unit 370 to make the holding part 380 not restrained with respect to the base unit 310. Then, the control device 105 supplies air to the second air cylinder 373 of the lock and free unit 370 to center the holding part 380 with respect to the base part 310, as illustrated in FIG. 24D, and thereafter supplies air to the first air cylinder 371 of the lock and free unit 370 to lock the floating unit 320.

Figure 24E:
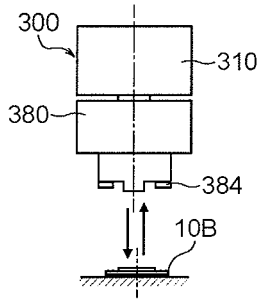

Then, in step S25 of FIG. 22, as illustrated in FIG. 24E, the Z-direction actuator 124 extends to lower the contact arm 300, which once places the DUT 10B on the first Y-direction buffer 160.

The routine then returns to step S11 of FIG. 22 in which the control device 105 releases all the air cylinders 371 and 373 of the lock and free unit 370 to make the holding part 380 not restrained with respect to the base part 310.

Then, the above-described process of steps S11 to S33 is performed again only for the over-range contact arm 300 while moving the slide portion 212 of the alignment device 200 along the X direction. Before starting these steps S11 to S33, the slide portion 212 of the alignment device 200 is returned in −X direction.

Figure 24F:
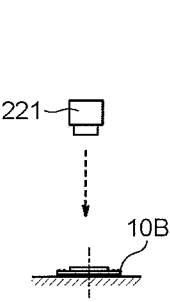

Specifically, in step S12 of FIG. 22, as illustrated in FIG. 24F, the second camera 221 images the DUT 10B. Then, in step S13 of FIG. 22, the control device 105 recognizes the second terminal position by performing image processing on the image information. Then, in step S14 of FIG. 22, the control device 105 calculates a second correction amount $\Delta AL_2'$ for the position of the holding part 380.

When step S12 of the first round is performed, step S12 of the second and subsequent rounds may be omitted. In this case, the newest second correction amount $\Delta AL_2'$ is calculated by subtracting the maximum alignment amount $AL_{max}$ of step S21 from the second correction amount $\Delta AL_2$ calculated in step S14 of the first round.

Then, in step S15 of FIG. 22, the control device 105 determines whether or not the second correction amount $\Delta AL_2'$ is the maximum alignment amount $AL_{max}$ or less ($\Delta AL_2' \leq AL_{max}$).

Figure 24G:
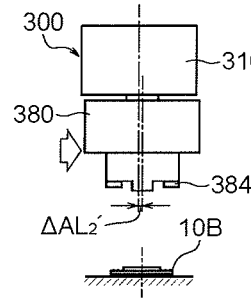
Figure 24H:
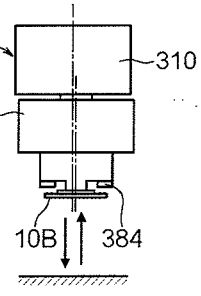

With regard to contact arms 300 that are determined not to be over-range contact arms in step S15 ("YES" in step S15, i.e., $\Delta AL_2' \leq AL_{max}$), the control device 105 drives the operation unit 230 of the alignment device 200, in step S31 of FIG. 22, to move the holding part 380 by the second correction amount $\Delta AL_2'$ via the adjustment unit 330 of the contact arm 300, as illustrated in FIG. 24G.

Then, in step S32 of FIG. 22, the floating unit 320 is locked by supplying air to the first air cylinder 371 of the lock and free unit 370 and, in step S33 of FIG. 22, the contact arm 300 holds the DUT 10B. Then, when all the contact arms 300 provided at the first movable head 122 are not over-range contact arms, the previously-described steps S42 to S80 (secondary alignment step, pressing step, and testing step) are performed.

On the other hand, when one or more over-range contact arms 300 remain, the above process is repeated until there are no contact arms 300 that are determined as over-range contact arms in step S15 of FIG. 22.

As the above, in the present embodiment, when there are one or more over-range contact arms, the preliminary alignment work (steps S11 to S15 and S21 to S25 of FIG. 22) is performed at least once as in the first embodiment, while when there are no over-range contact arms, the main alignment work (steps S11 to S15 and S31 to S33 of FIG. 22) is performed. Thus, even when the second correction amount $\Delta AL_2$ for the DUTs 10B exceeds the maximum alignment amount $AL_{max}$ of the alignment device ($\Delta AL_2 > AL_{max}$), the main alignment work can be performed and it is therefore possible to improve the operation rate of the electronic component handling apparatus.

It should be appreciated that the embodiments heretofore explained are described to facilitate understanding of the present invention and are not described to limit the present invention. It is therefore intended that the elements disclosed in the above embodiments include all design changes and equivalents to fall within the technical scope of the present invention.

For example, the step of limiting the number of executions of the preliminary alignment work as described in the second embodiment (steps S47 to S49 of FIG. 18) may be added to the testing method described in the fourth embodiment.

DESCRIPTION OF REFERENCE NUMERALS

1 Electronic component testing apparatus
100 Handler
  105 Control device
200 Alignment device
  210 Moving unit
  220 Imaging unit
    221 Second camera
  230 Operation unit
300 Contact arm
  310 Base part
  320 Floating unit
  330 Adjustment unit
  370 Lock and free unit
  380 Holding part
    381 Suction pad
    382 Tip
    383 Marker
    384 Intermediate socket
400 Test head
  410 Socket
  420 Socket guide
500 Tester
10A, 10B DUT

What is claimed is:

1. An electronic component handling apparatus configured to handle a device under test (DUT), the apparatus comprising:
a contact arm having a holding part configured to hold the DUT, the contact arm being configured to press the DUT against a socket;
an alignment device including an imaging part and a driving part, the imaging part being configured to image the DUT to acquire image information, and the driving part being configured to move the holding part within a maximum moveable amount so as to adjust a position of the holding part; and
a control device configured to control the contact arm and the alignment device, wherein,
the maximum movable amount is an invariable value,
the driving part cannot move the holding part over the maximum movable amount,
the control device calculates a correction amount for respectively positioning the holding part with respect to the socket on a basis of the image information,
the control device determines whether the correction amount is larger than the maximum movable amount,
when the correction amount is larger than the maximum movable amount, the control device controls the driving part to move the holding part by the maximum movable amount, and
when the correction amount is not larger than the maximum movable amount, the control device controls the driving part to move the holding part by the correction amount.

2. The electronic component handling apparatus according to claim 1, wherein
when the correction amount is larger than the maximum movable amount, the control device controls the contact arm and the alignment device to perform a preliminary alignment work,
when the correction amount is not larger than the maximum movable amount, the control device controls the contact arm and the alignment device to perform main alignment work for relatively positioning the DUT with respect to the socket,
the preliminary alignment work includes:
a first operation in which the holding part holds the DUT,
a second operation in which the driving part moves the holding part by the maximum movable amount, and
a third operation in which the holding part places the DUT, and
the main alignment work includes:
a fourth operation in which the holding part holds the DUT again, and
a fifth operation in which the driving part moves the holding part by the correction amount, and
the control device controls the contact arm to press the DUT against the socket after the main alignment work.

3. The electronic component handling apparatus according to claim 2, wherein
the socket is provided at a test head or at a tip of the holding part,
at least the preliminary alignment work of the preliminary alignment work and main alignment work includes an operation in which the imaging part images the DUT, and
the DUT imaged by the imaging part is in a state of being held by the holding part or in a state before being held by the holding part.

4. The electronic component handling apparatus according to claim 1, wherein
the contact arm has
a base part,
an adjustment unit configured to relatively move and/or rotate the holding part with respect to the base part, and
a lock and free unit configured to restrain relative movement and/or rotation of the holding part with respect to the base part, and
the driving part includes an operation unit configured to operate the adjustment unit.

5. An electronic component testing apparatus configured to test a DUT, comprising:
the electronic component handling apparatus according to claim 1;
a test head to which the socket is attached; and
a tester to which the test head is electrically connected.

6. An electronic component testing method for relatively positioning a device under test (DUT) with respect to a socket using image information of the DUT and testing the DUT,
the electronic component testing method being performed using an electronic component handling apparatus,
the electronic component handling apparatus comprising:
a contact arm having a holding part configured to hold the DUT, the contact arm being configured to press the DUT against a socket; and an alignment device including an imaging part and a driving part, the imaging part being configured to image the DUT to acquire image information, and the driving part being configured to move the holding part within a maximum movable amount so as to adjust a position of the holding part, wherein the maximum alignment amount is an invariable value, and the driving part cannot move the holding part over the maximum movable amount, the method comprises:

calculating a correction amount for respectively positioning the holding part with respect to the socket on a basis of the image information, determining whether the correction amount is larger than the maximum movable amount, moving the holding part with the driving part by the maximum movable amount when the correction amount is larger than the maximum movable amount; and moving the holding part with the driving part by the correction amount when the correction is not larger than the maximum movable amount.

* * * * *